(12) United States Patent
Kang et al.

(10) Patent No.: US 12,707,626 B2
(45) Date of Patent: Aug. 11, 2026

(54) METHOD FOR FABRICATING SEMICONDUCTOR DEVICE WITH OXIDE SEMICONDUCTOR MATERIAL

(71) Applicant: Tokyo Electron Limited, Tokyo (JP)

(72) Inventors: Song yun Kang, Tokyo (JP); Hyuck Soo Yang, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 578 days.

(21) Appl. No.: 18/029,660

(22) PCT Filed: Oct. 4, 2021

(86) PCT No.: PCT/JP2021/036683
§ 371 (c)(1),
(2) Date: Mar. 31, 2023

(87) PCT Pub. No.: WO2022/075278
PCT Pub. Date: Apr. 14, 2022

(65) Prior Publication Data

US 2023/0371242 A1 Nov. 16, 2023

Related U.S. Application Data

(60) Provisional application No. 63/087,340, filed on Oct. 5, 2020.

(51) Int. Cl.
*H10B 12/00* (2023.01)
*H10D 30/63* (2025.01)

(52) U.S. Cl.
CPC ........... *H10B 12/05* (2023.02); *H10B 12/033* (2023.02); *H10B 12/482* (2023.02); *H10B 12/488* (2023.02); *H10D 30/63* (2025.01)

(58) Field of Classification Search
CPC ...... H10B 12/033; H10B 12/05; H10B 12/31; H10B 12/482; H10B 12/488;
(Continued)

(56) References Cited

U.S. PATENT DOCUMENTS

2006/0148134 A1* 7/2006 Hwang ................ H10B 12/482 700/121
2010/0237407 A1 9/2010 Nojima
(Continued)

FOREIGN PATENT DOCUMENTS

JP 2015-18940 A 1/2015
JP 2015-111663 A 6/2015

OTHER PUBLICATIONS

International Search Report and Written Opinion mailed on Nov. 22, 2021, received for PCT Application PCT/JP2021/036683, filed on Oct. 4, 2021, 7 pages including English Translation.

*Primary Examiner* — Britt Hanley
*Assistant Examiner* — Kevin Quinto
(74) *Attorney, Agent, or Firm* — XSENSUS LLP

(57) ABSTRACT

A method of making a semiconductor device that includes forming a vertical access transistor including forming bit lines in a first direction on a substrate, forming a polysilicon pillar as a sacrificial pillar over each bit line of the bit lines, forming a gate oxide on side surfaces of the polysilicon pillar, forming a word line, in a second direction, on the polysilicon pillar with the gate oxide interposed between the word line and the polysilicon pillar, the second direction being not substantially parallel to the first direction, after forming the word line, removing the polysilicon pillar so as to leave a vertical void in place of the polysilicon pillar, filling the vertical void with an oxide semiconductor that
(Continued)

serves as a channel for the vertical access transistor; and forming a cell capacitor over the channel of the vertical access transistor.

7 Claims, 19 Drawing Sheets

(58) Field of Classification Search
CPC .... H10B 12/315; H10B 12/485; H10D 1/716; H10D 30/63; H10D 30/6728; H10D 30/6755; H10D 99/00
See application file for complete search history.

(56) References Cited

U.S. PATENT DOCUMENTS

| | | | | |
|---|---|---|---|---|
| 2011/0002159 | A1* | 1/2011 | Suzuki | G11C 11/4097 365/230.06 |
| 2013/0037873 | A1 | 2/2013 | Suzuki et al. | |
| 2020/0111800 | A1* | 4/2020 | Ramaswamy | H10B 12/033 |
| 2021/0265358 | A1* | 8/2021 | Tsai | H10B 12/05 |

* cited by examiner 302
303
304
305

2F
2F 411
415
422
419
417
421

425
427

411
415
423

411
423

437
435
441
425
427

435

433
431

913
911

915
913
911

917
915
913
911
909
907
905
903
901

1013

1011
1009
1007
1005
1003
1001

1001

913
911

913
911
1107

1005
1003
1001

1005
1003
1001

1111
1113

1113
1111

1109

1409

1405
1407

1405
1403

1401

1505
1503A

1503A

1501

1503B
1505

1503B

METHOD FOR FABRICATING SEMICONDUCTOR DEVICE WITH OXIDE SEMICONDUCTOR MATERIAL

CROSS REFERENCE TO RELATED APPLICATIONS

The present application is based on PCT filing PCT/JP2021/036683, filed Oct. 4, 2021, which claims the benefit of the earlier filing date of U.S. Provisional Patent Application No. 63/087,340, filed Oct. 5, 2020, the entire contents of each of which are being incorporated herein by reference.

TECHNICAL FIELD

The present disclosure relates to a method for fabricating a semiconductor device with an oxide semiconductor materials, such as an IGZO material.

BACKGROUND

Oxide semiconductors (OSs) have been actively developed in recent years. Crystalline oxide semiconductor materials such as Indium Gallium Zinc Oxide (IGZO) compounds can have a c-axis aligned crystal structure. An IGZO transistor (an OS transistor) has extremely low off-state current. A dynamic random access memory (DRAM) using this device for access transistors in memory cells can retain data for an extremely long period of time by drastically reducing the off-state current of the access transistors in the memory cells. Consequently, the refresh cycle of the DRAM can be very long and there is no need for refresh operation in practical use for DRAMs. The DRAM using an IGZO access transistor can inherit performance and technology from the general DRAM and can be close to a universal memory.

SUMMARY

According to an aspect of the present disclosure, substrate processing scheme are described. More particularly a method is described of making a semiconductor device that includes forming a vertical access transistor including forming bit lines in a first direction on a substrate, forming a polysilicon pillar as a sacrificial pillar over each bit line of the bit lines, forming a gate oxide on side surfaces of the polysilicon pillar, forming a word line, in a second direction, on the polysilicon pillar with the gate oxide interposed between the word line and the polysilicon pillar, the second direction being not substantially parallel to the first direction, after forming the word line, removing the polysilicon pillar so as to leave a vertical void in place of the polysilicon pillar, filling the vertical void with an oxide semiconductor that serves as a channel for the vertical access transistor; and forming a cell capacitor over the channel of the vertical access transistor.

According to another aspect, a method of making a semiconductor device includes depositing an oxide semiconductor on a conductive material that is disposed on an oxide, forming vertical plates that each include the oxide semiconductor by etching the oxide semiconductor, each plate having a width that is substantially one dimension of a memory cell, filling voids between the series of vertical plates with an oxide, forming a mask material over the vertical plates and the oxide, the mask material including a set of parallel mask ridges arranged at a predetermined pitch in a first direction that is substantially orthogonal to main sides of the vertical plates such that interstices are present in areas not covered by the set of parallel mask ridges and not covered by the oxide so as to expose portions of the vertical plates via the interstices, etching the oxide semiconductor as masked by the mask material and then removing the mask material and the oxide to form vertical pillars of the oxide semiconductor in regions covered by the set of parallel mask ridges, depositing a gate oxide on side surfaces of the vertical pillars, and forming a metal gate on the gate oxide of each vertical pillar to form a plurality of word lines, wherein the conductive material forms a plurality of bit lines corresponding to the vertical pillars.

BRIEF DESCRIPTION OF DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF EMBODIMENTS

Figure 1:
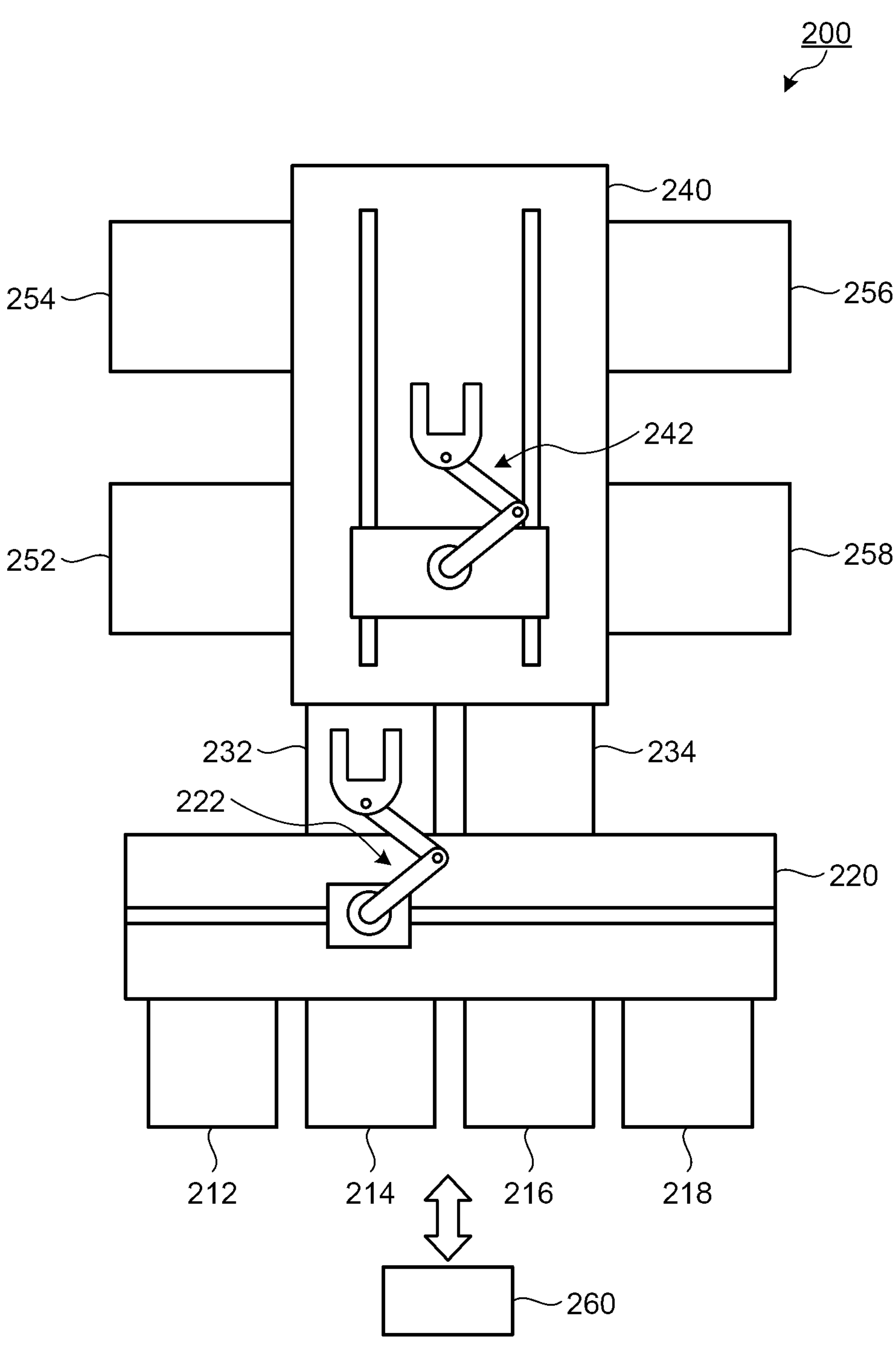
FIG. 1 is a diagram of a substrate processing apparatus used to form a semiconductors according to the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The methods and systems described herein may be implemented using computer programming or engineering techniques including computer software, firmware, hardware or any combination or subset thereof, wherein the technical effects may include at least enabling improvements in substrate processing efficiency to alter a condition of a substrate.

As recognized by the present inventors, for DRAM applications, a surrounding gate transistor (SGT) as a cell driver has an issue with parasitic BL junction capacitance. As feature size shrinks, a doping concentration of a substrate increases in order to suppress the leakage current between junctions and, therefore, the parasitic junction capacitance which is connected in parallel to the storage node also increases. Conventional 6F2 DRAMs do not have as big a BL parasitic junction capacitance issue because a BL contact shares just two BL junctions with adjacent cells. The gate oxide quality of SGT can be improved by plasma enhanced oxidation (PEO). PEO replaces thermal energy by plasma for oxygen diffusion through oxide film during oxidation and, therefore, it enables low temperature oxidation, which is especially crucial for 3D IC integration because low temperatures do not alter device functions and metal lines underneath the SGT memory cells on top. PEO is independent to crystalline orientation. Comparisons between conventional high temperature oxidation and PEO suggest that PEO is a better method for gate oxidation for SGT memory cells. The high gate leakage current from conventional thermal oxidation may come from weak gate oxide spots. Distribution of hard breakdown for PEO is somewhat narrower than that for conventional high temperature oxidation.

Non-uniform cell characteristics of SGT array, depending on cell location comes from high BL series resistance because the BL junction is shallow and narrow on the silicon substrate. To address this a low resistance metal path under the BL may be used. The metal line path directly connected to the BL provides low series resistance and, therefore, SGT cell characteristic is independent to the cell location. Various metals, such as aluminum and tungsten, can be used as a BL path.

Unlike SGT on silicon substrate, the high density SGT cell array on 3D IC does not include parasitic junction capacitance at all because the BL is on the metal line, not on the silicon substrate. As a result, the proposed 3D memory cell structure on a 3D IC eliminates both high BL series resistance and parasitic BL junction capacitance. BL-BL parasitic capacitance of SGT cell array on 3D IC is much lower than on bulk silicon because permittivity of silicon dioxide is about 3 times less than that of silicon. Therefore, high density SGT memory cells on 3D IC provide very low parasitic capacitance.

Furthermore, with respect to forming an airgap between bit lines in the access transistor portion of the 4F2 DRAM cell, there exists a problem of bit line capacitance developed between parallel bit lines, which creates a reactive component that inhibits efficient signal propagation when dispatching bit line read/write instructions to particular cells. This bit line capacitance issues is particularly pronounced in structures, such as 4F2 DRAM structures where the footprint of each cell is so small. To address this issue, the present inventors identified processes to create an air gap between bit lines so as to reduce the capacitance between bit lines and reduce the impedance experienced for signal propagation in the respective bit lines.

Processing System

FIG. 1 illustrates a substrate processing system 200 according to the present disclosure. In particular, the substrate process system 200 is used to implement the various substrate manufacturing processes described herein to make the resulting semiconductor structures described herein. Substrate processing system 200 includes transfer device 240 (that operates at a reduced pressure with respect process chambers 252, 254, 256, and 258) that includes a transfer robot 242 to transport a substrate W, to and from process chambers 252, 254, 256, and 258. The transfer device 240 has a vacuum transportation chamber that interfaces with load lock chambers 232 and 234. Process chambers 252, 254, 256, and 258 are connected to the transport device 240 and partitioned from load lock chambers 232 and 234. Process chambers 252, 254, 256, and 258 are configured to perform all semiconductor manufacturing steps as discussed herein including deposition, etching, ash-less carbon (ALC) processing, etc.

Load lock chambers 232 and 234 provide a way to compartmentalize environments between the transfer device 240 and the loader device 220. The loader device 220 has a carrier placing table in which a carrier is placed. The carrier holds, for example, twenty five substrates W and when moved in and out of the substrate processing system 200 is placed on a front surface of the loader device 220. The loader robot 222 transports substrates between the carrier placing table and the load lock chambers 232 and 234. Carriers are exchanged in respective load ports 212-218.

Figure 20:
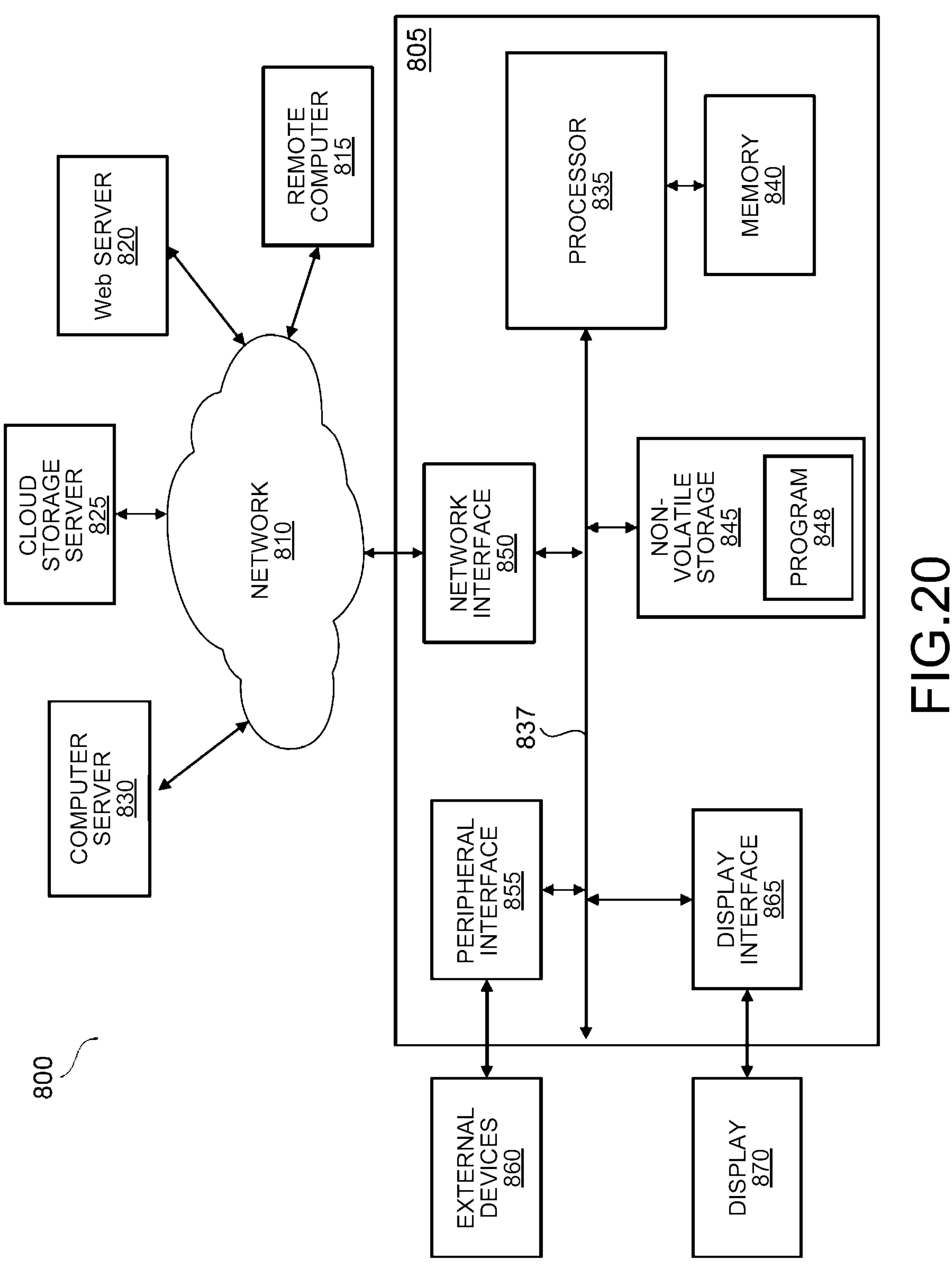
FIG. 20 is a block diagram of a computer-based system used to control processes performed in embodiments according to the present disclosure.

A controller 260, in this example is a microcontroller, although a computer (local dedicated computer, or distributed computer) and/or processing circuitry such as that described in FIG. 20 may be used as an alternative of controller circuitry that is configured by computer-executable code to perform control operations described herein. The processing system 200 may be used as a single system, or in combination with other semiconductor manufacturing equipment such as thermal systems, ion-implantation systems, film deposition systems, lithography/patterning systems, and removal systems to make 4F2 DRAM devices according to the present disclosure.

Figure 2:
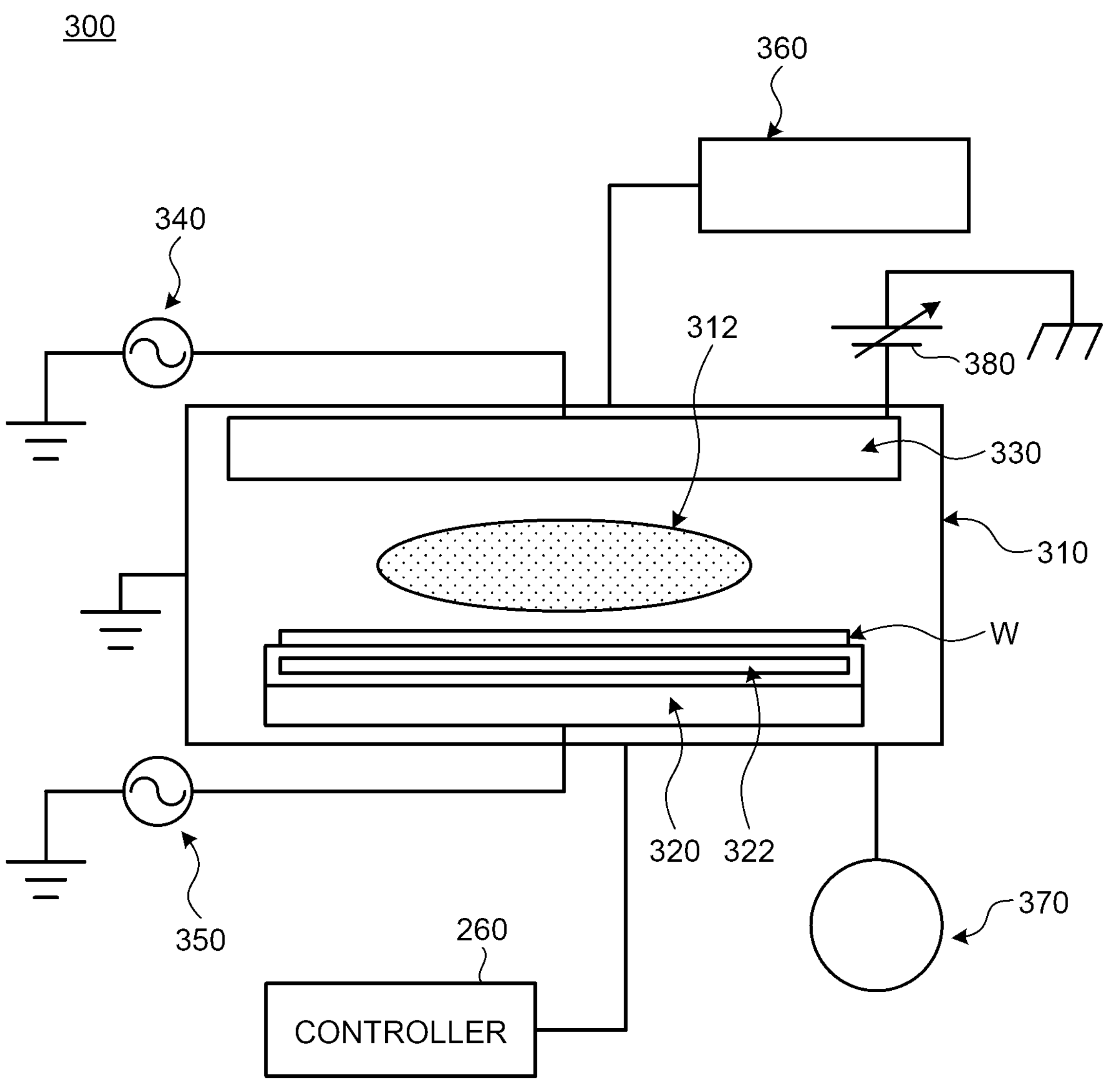
FIG. 2 is a diagram of a process chamber implemented as an etching system used to process a semiconductor substrate in various ways including etching, according to the present disclosure.

FIG. 2 schematically illustrates an exemplary etching apparatus 300, e.g., a capacitively coupled plasma (CCP) plasma system, that couples to the transfer device via a gate valve. While a CCP system is shown as an example, any other etching apparatus may also be used, such as inductively coupled plasma (ICP) apparatus and the like. The etching apparatus 300 includes a reaction chamber 310, which is approximately cylindrical in shape and formed of, for example, aluminum. The reaction chamber 310 is connected to ground potential. A film having plasma resistance is formed on the inner wall surface of the reaction chamber 310, and may be a film formed by an anodic oxidation treatment or a ceramic film, such as a film formed of yttrium oxide. When RF power is supplied to at least one of the upper electrode 330 and base 320 (serving as a lower electrode for generating plasma in the reaction chamber 310), a plasma 312 is developed between the upper electrode 330 and the base 320, with a substrate W to be processed therebetween. The plasma 312 is formed proximate to the substrate W, and the substrate W is held on an upper surface of an electrostatic chuck 322 as will be discussed in more detail below. The base 320 has an approximately disc shape and is conductive.

A gas source 360 includes a plurality of gas sources that are controlled via a corresponding series of flow rate controllers. The gas source 360 provides the gases via one or more gas lines to the reaction chamber 310.

The etching apparatus 300 further includes a first RF power supply 340 that generates RF energy in an inclusive range of 27 MHz through 100 MHz, with 60 MHz being an exemplary frequency. The first RF power supply 340 is connected to the upper electrode 330 through a matching circuit that matches an output impedance of the first RF power supply 340 and an impedance of the upper electrode 330.

The etching apparatus 300 further includes a second RF power supply 350 that generates RF energy for bias purposes so as to attract ions to the substrate W. An operational frequency of the second RF power supply 350 is lower than that for the first RF power supply 340, typically in a range of 400 kHz to 13.56 MHz. In an alternate embodiment, multiple RF power supplies 340 and 350 may be coupled to the same electrode (lower electrode 320).

The upper electrode 330 has a second power supply, which is a variable direct current (DC) power supply 380. The variable DC power supply 380 may also serve as a DC bias for the RF energy applied to the upper electrode from the first RF power supply 340. The variability of the DC power supply 380 allows for operational control over ion energy such that etch rates are controllable depending on the process being performed.

The RF energy generated by RF power supply 350 may be pulsed. When bias electric power is supplied to the base/lower electrode, etching mainly occurs. When bias electric power is not supplied to the base/lower electrode, deposition mainly occurs. A pulsed bias allows to separate the etch phase from the deposition phase. Etching occurs after a protective film is formed, and the sidewall of the recess is protected from side etch. Additionally, a change of duty of the pulse (bias on time/(bias on time+bias off time)) can control an etch/deposition balance. A longer bias off time can form protective film thicker, which leads to more protection. A longer bias on time increases an etch rate.

In an embodiment, the etching apparatus 300 may have dedicated control circuitry (e.g., processing circuitry such as that in FIG. 20) that operates exclusive of or in collaboration with the controller 260 (FIG. 1). The controller 260 executes a control program stored in memory, and controls each component of the etching apparatus 300 based on recipe data stored in the storage device.

The etching apparatus 300 includes an exhaust device 370 that is connected to an internal atmosphere of the reaction chamber 310. The exhaust device 370 includes a pressure controller, such as an automatic pressure control valve, a vacuum pump (e.g., turbo molecular pump), so as to controllably depressurize the reaction chamber 310 and exhaust gases from the reaction chamber 310.

4F2 Structure and Manufacturing Processes

Figures 3A, 3B:
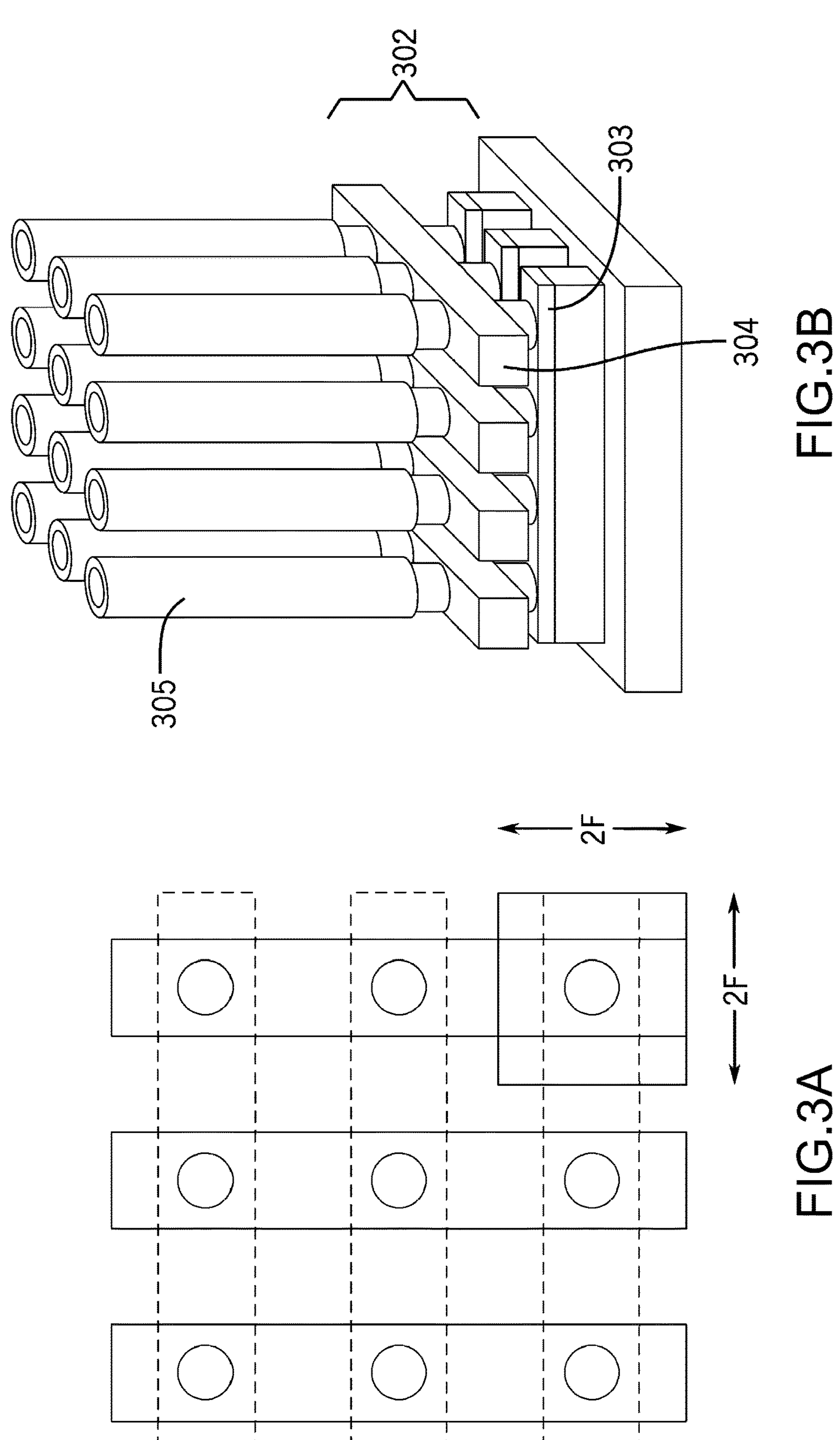
FIG. 3A is a plan view of a set of nine 4F2 Dynamic Random Access Memory (DRAM) cells, each occupying an area of (2F×2F), where "F" is a feature size.
FIG. 3B is a perspective view of the nine 4F2 memory cells shown in a 3D format to highlight underlying access transistor and vertical capacitors.

Referring to FIGS. 3A and 3B, a 4F2 cell architecture is a compact cell architecture that uses a Vertical-channel access transistor (VCAT) 302. The vertical pillar transistor (VPT) is a type of vertical transistor with a pillar shaped Si channel (or IGZO channel) standing at every crossing-point of WLs and BLs. The unit cell possesses 1F (i.e., one feature size) of active region and another 1F of field region in both X and Y directions, and eventually occupies 4F2 (=2F×2F) area. Since the components of storage node, active channel, and BL contact are integrated into the same 1F2 area, the channel of VPT is built on a buried BL and under a storage node. The BL capacitance of VPT decreases as compared to the recessed channel access transistor (RCAT) of which storage node closely faces the BL. Buried BLs are made by executing a N-type implantation on the Si substrate and cutting through it for isolating the BLs electrically. The WL of VPT surrounds the Si channel (or IGZO channel) and enhances the gate controllability and current driving capability.

As a brief summary, which will be expanded substantially in reference to the figures, fabricating a VPT includes the following process. After ion implantation, the pillar-shaped active region is built up by crossing line-shaped patterns through double pattern technology (DPT) and dry etching process. The nitride spacer for replacement gate protects the sidewall of Si pillars from following ion implantation and secures the space, which will be later used for forming WLs. Next, the buried BLs are formed under the pillar-shaped channel through high dose N-type implantation and electrically isolating the BLs by cutting off the Si substrate.

A replacement gate is removed selectively and gate poly silicon is deposited after gate oxidation process. Another high dose implantation process forms the junction for storage node on the top of Si pillar, followed by WL patterning. Finally, cell capacitors are built up over storage nodes after integrating peripheral devices. The fabrication of the vertical access transistors and associated cell capacitors will be described in more detail with respect to the corresponding figures.

The surrounding gate structure of a VPT significantly improves the electrical performance compared to RCAT. Data retention time is an important characteristic for low power operation in DRAM devices. During both static and dynamic operation, retention time is measured using checkerboard pattern that data "1" and "0" are written alternately. In a static operation mode, failed-bits do not appear until several seconds. However, dynamic retention characteristics are worse than static retention. 3D device simulation has been executed to study the fail-mechanism in dynamic operation and explore ways to improve it.

The capacitor on storage node is charged up to 1V that represent data "1". Since the channel of VPT is a type of floating body isolated from sub-Si by expansion of junction at BL contact, the bipolar junction transistor (BJT) action happens according to the bias conditions of storage node and BL. When the BL bias is switched from BLH(1V) to BLL(0V), it triggers the BJT action and eventually the storage node voltage steps down accordingly.

When the WL is in an off-state and data "1" is written at storage node, holes generated by gate-induced drain leakage (GIDL) are injected into the body and piled up in the floating body, which gradually raises the body potential. Then, when the BL pulse is switched from BLH to BLL, the energy barrier height between the floating body and BL decreases and the ever lowering barrier height triggers a BJT action. The BJT action allows huge electron current to flow from BL to storage node and lowers the potential level of storage node.

FIG. 3A illustrates a structure of a 4F2 scale dynamic DRAM, including a plan view. FIG. 3B shows the 4F2 scale dynamic DRAM in a perspective view so vertical pillar storage capacitors 305 may be seen with pitch spacing between adjacent capacitors at twice a feature size (2F), such that an area for a DRAM cell is 4F2, or 4F2, (2F×2F). The plan view of FIG. 3A shows a substrate with nine 4F2 DRAM structures formed thereon. Bit lines (BLs) run in a vertical direction, while word lines (WLs) are disposed orthogonally. A cell capacitor is seen, in this plan view, as a circle formed at a BL-WL junction. The BLs may be made of n+ junction (n+Si) or metal. In particular the access transistor includes a BL servicing as a drain (or source) with a the WL serving as a gate that surrounds a channel that interconnects the BL to the storage capacitor serving as a source (or drain). Thus, access to a charge stored in the capacitor is access via a control voltage applied to the WL.

In FIG. 3B, the DRAM cells are arranged in a matrix format with a plurality of BLs 303 and WLs 304 forming a matrix, as shown, with a stacked type vertical capacitor pillar 305 formed over each BL/WL intersection. In this embodiment, WLs surround the access transistors' channels, and thus serve as the access transistors' gates. The access transistor 302 includes each BL 303-WL 304 intersection with a semiconductor channel therebetween so as to provide/ extract charge to/from the corresponding vertical capacitor pillar 305 associated with that particular access transistor 302.

First Embodiment

FIGS. 4A-8C include images of a partially constructed 4F2 DRAM structure after successive process steps are performed so as to create self-aligned semiconductor oxide (for example, IGZO) vertical channel as part of the 4F2 DRAM structure. These steps are later summarized in the process flow of FIG. 17.

Figure 4B:
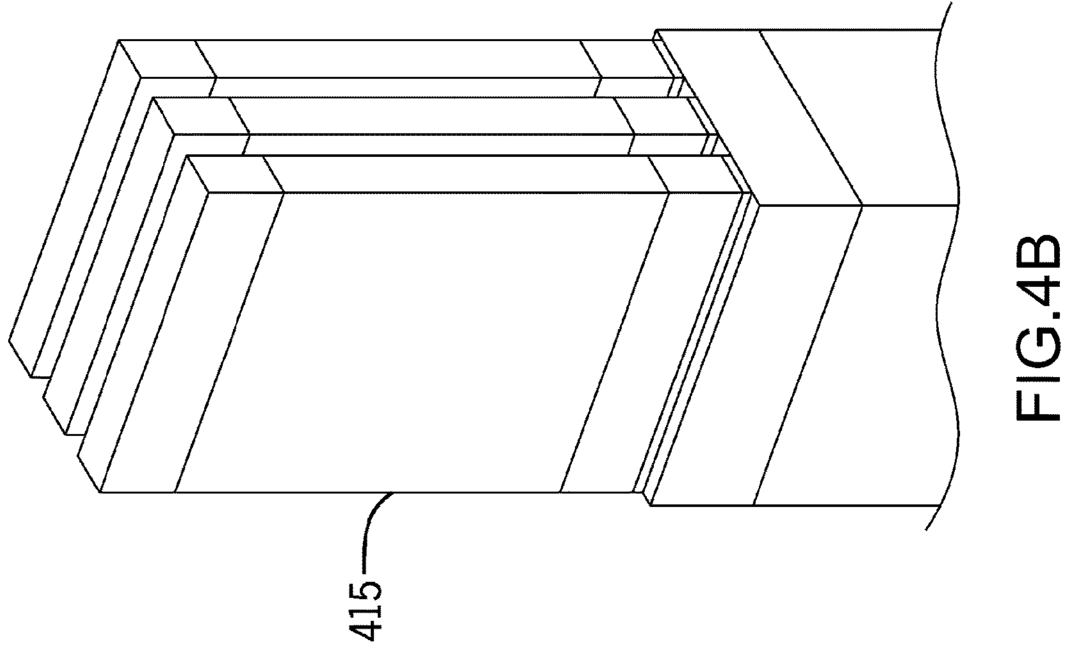
FIG. 4B is a structure of partially fabricated 4F2 memory cells as a result of W/TiN formation, after the processes described in FIG. 4A have been completed.
Figure 4A:
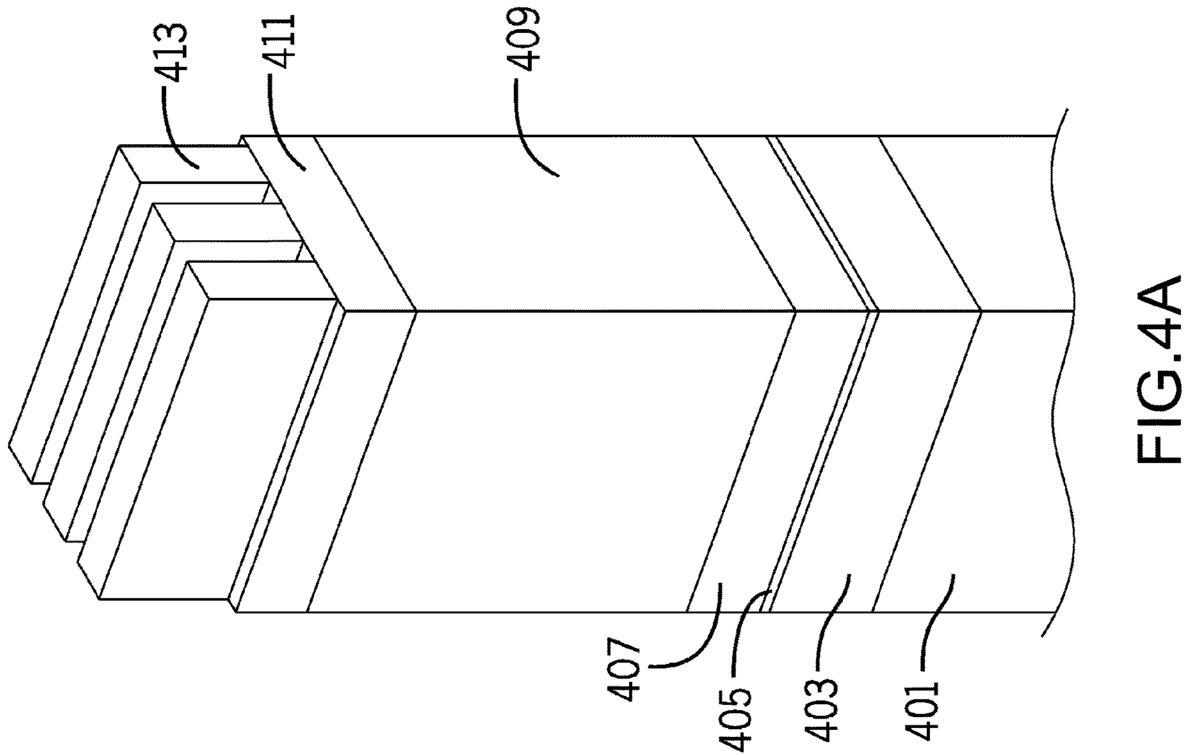
FIG. 4A is a structure of partially fabricated 4F2 memory cells during IGZO deposition and bit line (BL) patterning according to a first embodiment directed to a 4F2 DRAM structure with self-aligned vertical access transistors with metal BLs, and storage capacitors formed thereon.

FIG. 4A shows a stacked structure of a Si substrate 401, with successive layers of a dielectric layer (e.g., SiO2) 403, a metal layer (e.g., TiN) 405, and a metal layer (e.g., tungsten, W) 407 which will later form the conductors for BLs. The Si substrate 401 may be a passive substrate or include other circuitry such as CMOS components. The SiO2 may be formed via thermal oxidation or vapor deposition. In this example, the oxide is created in a deposition processes since a bare silicon surface is not available in the partially developed structure of this example. Thermal oxidation may be employed with an intermediate step of forming a silicon layer as a precursor. However, in the present example, the process step includes applying O2, or SiO2, so as to add oxygen and silicon in gaseous states to the process chamber (e.g., process chamber 254) of FIG. 1. Either silane pyrolysis (using silane gas SiH4 and oxygen O2 combined to form SiO2+2H2) or TEOS (SiO4C8H2O used to form SiO2+byproducts, where the SiO2 is deposited and the byproducts such as H2O in gaseous state are exhausted) is used.

For brevity, throughout this description, when a process has been described, such as oxide formation, with reference to an earlier figure, the same process will not be repeated in reference to subsequent figures.

In the example of FIG. 4A, because the BLs are made of metal, the metal layer 405 is formed as a barrier layer to separate the dielectric layer 403 from the metal layer 407. The metal layer 405 may be formed as a barrier metal via physical vapor deposition (e.g., PVD, such as via sputtering) or chemical vapor deposition (CVD). Likewise, the tungsten, W, may be deposited on the TiN via CVD using WF6.

An oxide semiconductor 409 including, for example, IGZO is then deposited, followed by deposition of an insulating film 411 including, for example, SiN and hard mask (HM) material (or other suitable hard mask) 413, which will later be used to define the BLs via etching via the self-aligned process. The oxide semiconductor 409 may be deposited via sputtering with a heated substrate, or formed via PVD of crystalline IGZO. As one example, the oxide semiconductor 409 may be made with a ratio of the respective elements (i.e., indium, gallium, zinc, and oxygen) as 1:1:1:1-4. One exemplary species of which is InGaZnO4. In some embodiments, the oxide semiconductor 409 is deposited as amorphous IGZO. However, in other embodiments, the IGZO is formed or deposited using processing conditions to enhance the crystalline structure thereof. In some embodiments, the IGZO is formed using PVD, where the IGZO is deposited via sputtering of a single target that includes indium, gallium, and zinc. Two or more targets may also be used (e.g., co-sputtering with an indium-zinc target and a gallium target). The oxide semiconductor 409 material is optionally subjected to an annealing process at a relatively low temperature (e.g., less than about 600° C.) in an ambient gaseous environment (e.g., nitrogen, oxygen, or ambient/air) to (further) enhance the crystalline structure of the IGZO. This optional heating process generally occurs between about 1 minute and an hour. Although the hard mask 413 is formed via photolithography in this embodiment (e.g., electron or ion beam photolithography that directly draws the mask pattern), the masks may be used as well such as a photoresist (via spin, exposure, and development).

FIG. 4B shows the structure after the insulating film 411 and oxide semiconductor 409 etching to provide, for example, SiN/IGZO/Metal (BL) vertical plates 415. The oxide semiconductor 409 may be etched, in the etching system of FIG. 2, with an etching gas containing CH4 and/or a Cl-containing etch gas (e.g., Cl2 or BCl3), and/or an F-containing etch gas (such as CF4). Alternatively, the oxide semiconductor 409 may be etched with a CF4/Ar plasma developed in the etching system of FIG. 2. Other dry etch processes may be used as well such as with a N2/Bl13/Ar plasma, as well as wet etch processes, such as using oxalic acid (HO2C—CO2H) as an etching agent. The insulating film 411 may also be etched with the device of FIG. 2. The plasma etching process uses a process composition having as incipient ingredients a process gas containing C, H and F, and a non-oxygen-containing additive gas, wherein the non-oxygen-containing additive gas includes H, or C, or both H and C, and excludes a halogen atom. Alternatively, the process composition consists of a process gas containing C, H and F, a non-oxygen-containing additive gas, and an optional noble gas, wherein the non-oxygen-containing additive gas includes H, or C, or both H and C, and excludes a halogen atom. The process gas may be oxygen-free.

The vertical plates 415 are created after the W/TiN etch so as to create self-aligned BLs in the metal layer 405 and the metal layer 407 containing the W/TiN material. Moreover, as can be seen in the intermediate structure of FIG. 4B, each vertical plate 415 includes a metal material at a bottom thereof that will eventually become BLs, with each BL having an IGZO portion formed thereon, which in turn is capped by insulating film 411. Etching of the tungsten (W), 407 or other metal, may be performed in the etching system of FIG. 2 with a composition containing a halogen containing gas, such as Cl2, HBr, or BCl3, and a fluorocarbon gas having the chemical formula CxHyFz, where x and z are equal to unity or greater and y is equal to 0 or greater. The metal layer 405 may be etched in a similar fashion.

Figures 5A, 5B, 5C, 5D:
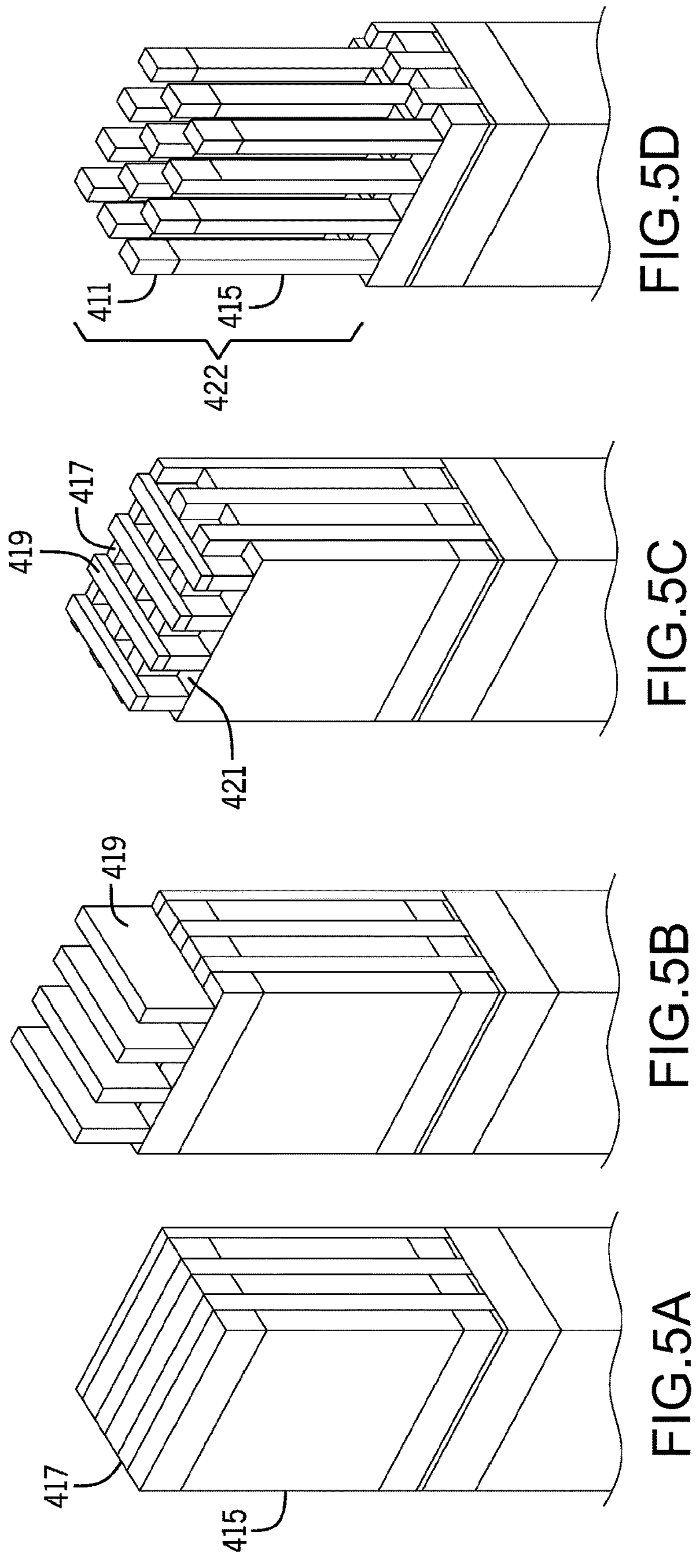
FIG. 5A is a structure of partially fabricated 4F2 memory cells during an oxide fill, after the processes described in FIG. 4B have been completed.
FIG. 5B is a structure of partially fabricated 4F2 memory cells during pillar patterning, after the processes described in FIG. 5A have been completed.
FIG. 5C is a structure of partially fabricated 4F2 memory cells during a SiN hard mask (HM) etch, after the processes described in FIG. 5B have been completed.
FIG. 5D is a structure of partially fabricated 4F2 memory cells after IGZO and SiO2 etch, after the processes described in FIG. 5C have been completed.

FIG. 5A shows the resulting structure after an oxide fill (e.g., SiO2 or SOH) is performed with an oxide material 417 disposed between vertical plates 415. Subsequently a chemical mechanical planarization (CMP) step is performed to remove and planarize overburden material from a surface of the structure by applying a downforce behind the structure and pressing the front surface against a rotating pad with a mixture of chemicals and abrasives therebetween. FIG. 5B shows the structure with an etch mask material 419 disposed thereon, via photolithography, in strips across the structure in a direction orthogonal to the vertical plates 415. These strips of the mask material 419 serve as an etch block to create a precursor to pillar formation of the 3D semiconductor structure.

As shown in FIG. 5C, after an etch back is performed on the insulating film 411, a resulting structure is created with ridges of the oxide material (SiO2 or other oxide) 417 cross-hatched with the stripes of the mask material 419 over top of the 3D-block of vertical plates 415 separated by the oxide material 417. Between the areas not covered by the oxide material 417 and the stripes of the mask material 419 are interstices 421 that leave exposed portions of the IGZO formed as vertical plates 415. Upon subjecting the structure to an IGZO and SiO2 to a further etch, intermediate IGZO vertical pillars 422 are formed with IGZO remnants (415) capped with insulating film remnants (411) of the vertical plates 415, as shown in FIG. 5D. As can be seen, bit line conductors 407 (FIG. 4A) are separated by residual oxide as a consequence of the elevated oxide ridges of the oxide material 417 (as shown in FIG. 5C). The dielectric layer 403 is etched in the etching system of FIG. 2 and exposes the silicon oxide to plasma of a processing gas containing a fluorocarbon gas so as to etch the region. A residual fluorocarbon deposit is normal present in the etched region and so a second etching of the region with a radical of the fluorocarbon contained in the deposit can be performed.

Figures 6A, 6B, 6C:
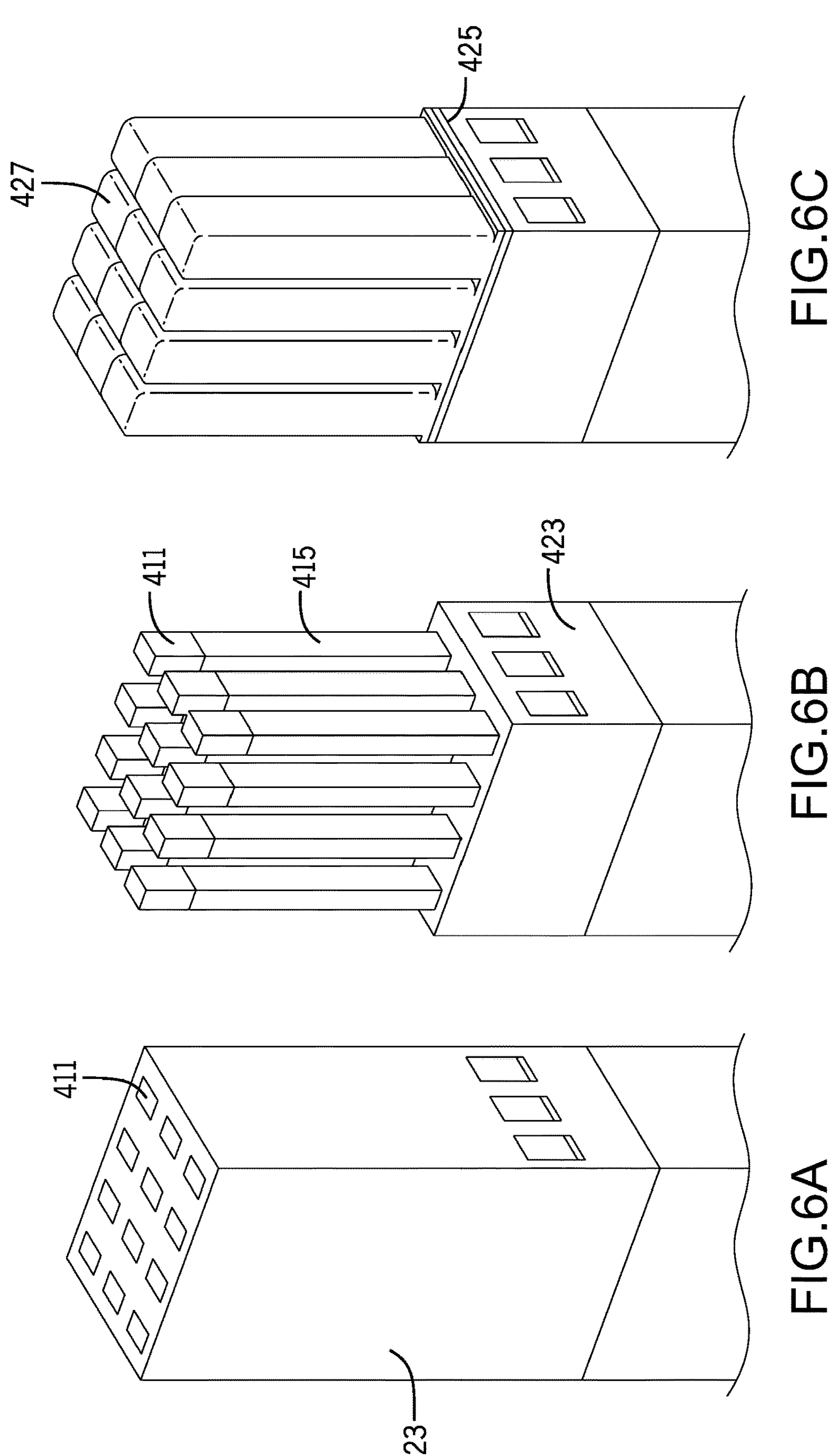
FIG. 6A is a structure of partially fabricated 4F2 memory cells during oxide fill, after the processes described in FIG. 5D have been completed.
FIG. 6B is a structure of partially fabricated 4F2 memory cells during oxide recess, after the processes described in FIG. 6A have been completed.
FIG. 6C is a structure of partially fabricated 4F2 memory cells during gate oxide deposition followed by gate metal deposition, after the processes described in FIG. 6B have been completed.

FIG. 6A shows the 3D structure of FIG. 5D after an oxide fill (e.g., O2 or SiO2) 423, followed by a CMP step to remove excess material on the top of the structure and create a smooth surface with exposed insulating films 411 at the top of each buried vertical pillar 422. Next, an oxide recess process is performed.

In an exemplary oxide recess process, the oxide may be removed by a chemical oxide removal process, or a dry etching process (and even a wet etching process). A chemical oxide removal process may be performed to remove the oxide layer from surrounding layers such as an Si layer and terminates the oxide (SiOx) with hydroxyl groups (—OH). A wet etching process may be performed utilizing buffered hydrofluoric acid (BHF). A dry etching process may be performed by exposing the structure to a gas containing HF, NH3, H2O2, a halogen containing gas, or a combination thereof. In one example, the process can include a chemical oxide removal (COR) process that uses HF and NH3 gas exposures to efficiently remove silicon and oxygen, whiles metal oxides films are not substantially etched. The process may etch SiO2 efficiently and at a high rate. The structure shown in FIG. 6B is a result of performance of the oxide recess process, and which includes exposed vertical pillars 422 of IGZO/SiN (415/411) that emerge from a block of the oxide fill 423.

Subsequently successive steps are performed of forming a gate oxide 425 (e.g., grown or deposited SiO2, that is doped, or SiON, Ta2O5, Ba1−xSrxTiO3 (BST), used as a dielectric) on exposed surfaces of the vertical pillars 422 of IGZO/SiN (415/411) and the oxide fill 423, followed by a deposited gate metal (e.g., TiN) 427 over the gate oxide 425. The resulting intermediate structure is shown in FIG. 6C. If deposited, gate oxide deposition may be performed by CVD method or ALD method. Gate metal deposition may also be performed by CVD method or ALD method. A Ti gas and an N gas are applied to the structure in the reaction chamber of substrate processing system 200.

Figures 7A, 7B, 7C:
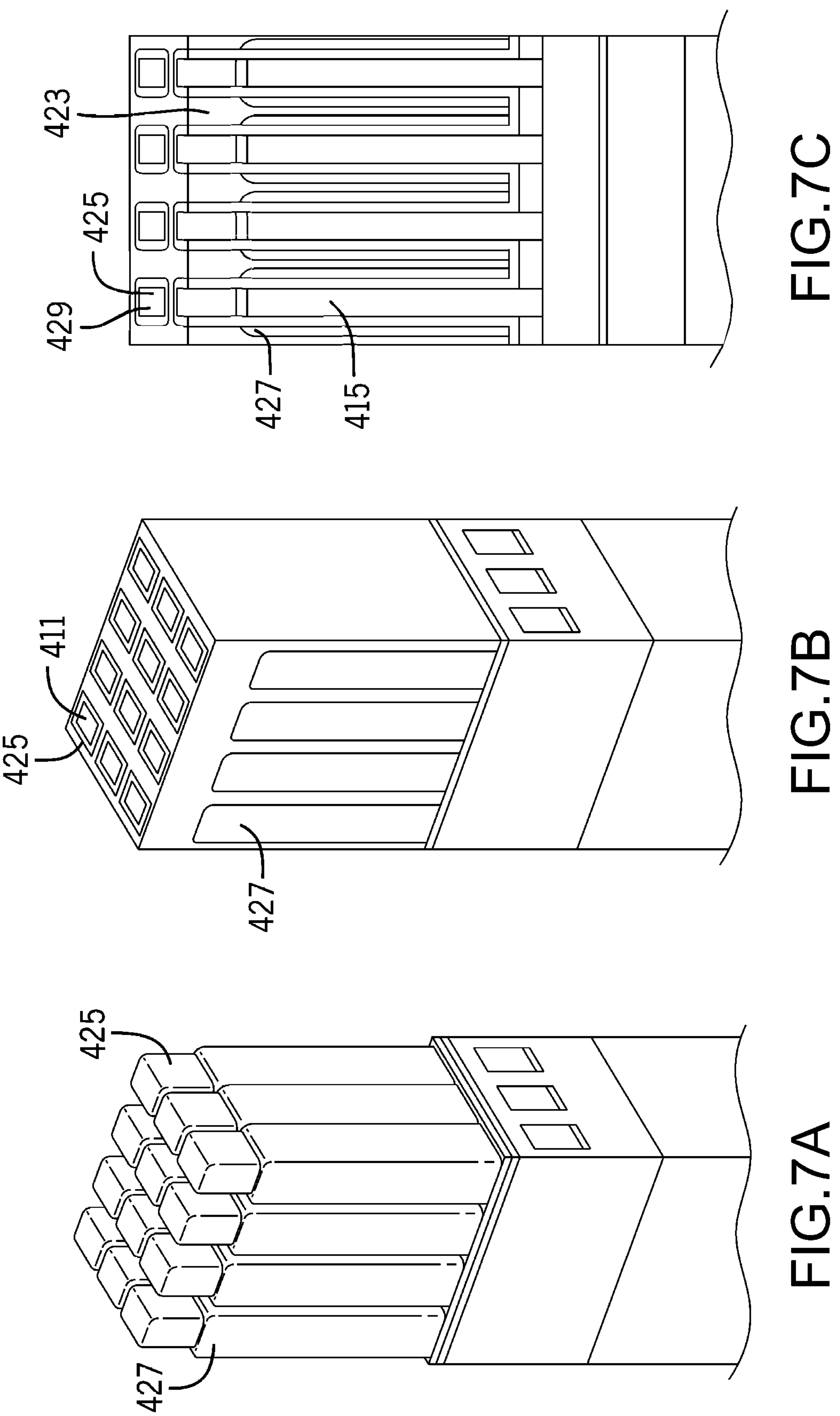
FIG. 7A is a structure of partially fabricated 4F2 memory cells during gate metal etch and recess, after the processes described in FIG. 6C have been completed.
FIG. 7B is a structure of partially fabricated 4F2 memory cells during oxide deposition and planarization, after the processes described in FIG. 7A have been completed.
FIG. 7C is a structure of partially fabricated 4F2 memory cells during HM removal and pillar void creation, after the processes described in FIG. 7B have been completed.

The gate metal 427 is then etched back so as to expose gate oxide 425, and define a gate length Lg, and provide an intermediate structure, as shown in FIG. 7A. In FIG. 7A, the gate metals 427 are continuous between adjacent vertical pillars 422 in a direction orthogonal to the bit line direction to form word lines while isolated between adjacent vertical pillars 422 in the bit line direction. Then, the structure shown in FIG. 7B is formed after successive steps of oxide deposition to encase the vertical pillars in oxide and CMP to flatten the top of the structure and expose the gate oxide 425, insulating film 411 on the edge of the 3D structure.

FIG. 7C shows a cross section of the 3D structure after an SiN insulator/mask is removed, leaving a void 429 at the top of each pillar with gate oxide 425 edges defining the boundary of the void 429. Also shown in cross section is the gate metal 427 (WL) about the IGZO for each pillar (formerly vertical plate 415) and separated by oxide fill 423.

The SiN hard mask may be removed by a dry etching process. The removal of the SiN from the structure includes plasma exciting a non-polymerizing process gas containing NF3, O2, and optionally Ar, N2, or both Ar and N2, and exposing the structure to the plasma-excited process gas. In one example, the non-polymerizing process gas contains or consists of N2, O2, NF3, and Ar. In other examples, Ar, N2, or both Ar and N2, may be used along with NF3 and O2 to optimize the etch process.

Figures 8A, 8B, 8C:
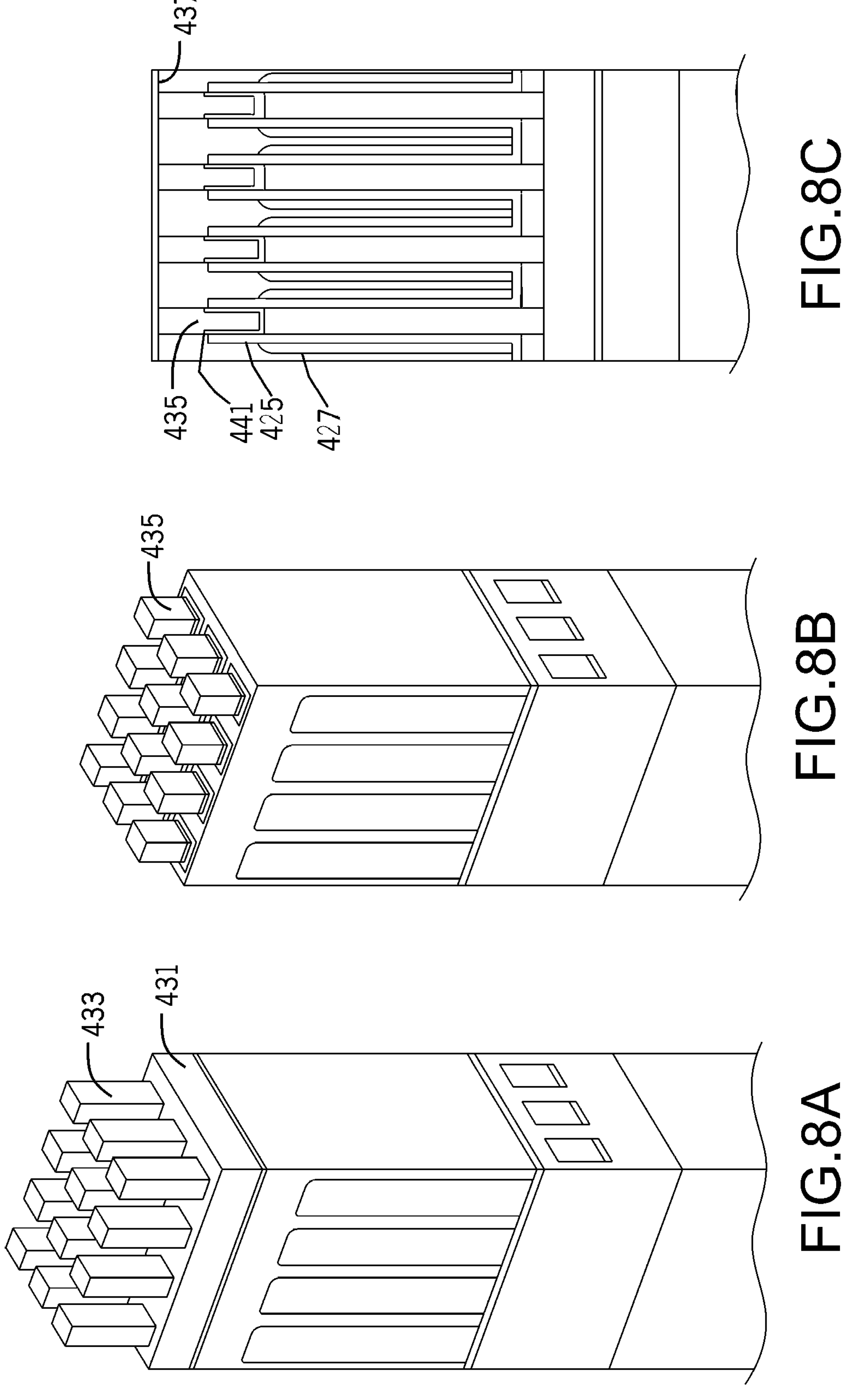
FIG. 8A is a structure of partially fabricated 4F2 memory cells during landing pad patterning, after the processes described in FIG. 7C have been completed.
FIG. 8B is a structure of partially fabricated 4F2 memory cells during metal etch and strip, after the processes described in FIG. 8A have been completed.
FIG. 8C is a side view cross section of a structure of fabricated 4F2 memory cells with IGZO vertical access transistors according to the first embodiment.

FIG. 8A shows the structure with a hard mask 433 pattern formed over each pillar with a metal layer 431 interposed therebetween, and then followed by an etch of the metal layer 431 with the hard mask 433 and strip step of the hard mask 433 to expose metal portions 435 for each pillar, as shown in FIG. 8B. After burying the metal portions 435 with additional oxide, an etch stopper 437 (e.g., SiBN) is formed over the metal portions 435, as shown in FIG. 8C. The etch stopper 437 may be deposited by CVD or ALD methods. This series of process steps exhibits a process for a self-aligned pillar and BL formation using IGZO deposition as an intermediate step in the formation of the 4F2 memory cells. Above etch stopper 437, the storage node capacitor for the memory cell is formed. Moreover, each storage node capacitor is formed on top of the access transistor.

Second Embodiment

Figures 9A, 9B, 9C:
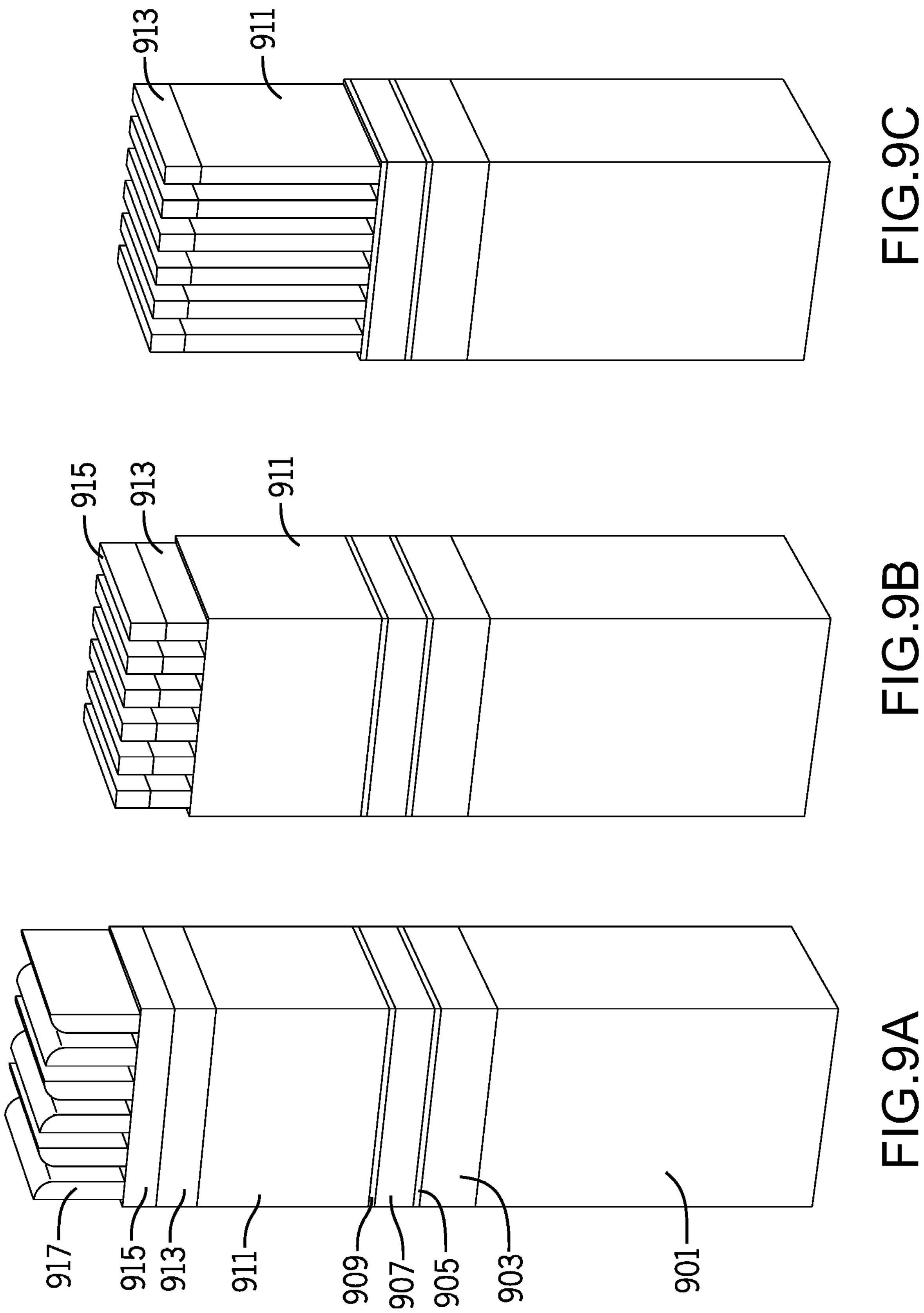
FIG. 9A is a structure of partially fabricated 4F2 memory cells during spacer formation according to a second embodiment.
FIG. 9B is a structure of partially fabricated 4F2 memory cells, according to a second embodiment, during etch, after the processes described in FIG. 9A have been completed.
FIG. 9C is a structure of partially fabricated 4F2 memory cells, during Si etch, after the processes described in FIG. 9B have been completed.

FIGS. 9A-9C show a starting stacked structure with consecutive layers of a Si substrate 901, a dielectric layer (e.g., SiO2) 903, a metal layer (e.g., TiN) 905, a metal layer (e.g., W) 907, a metal layer (e.g., TiN) 909, amorphous silicon (a-Si) 911, SiN hard mask 913 and Si hard mask 915. Si substrate 901, the dielectric layer 903, the metal layer 905, the metal layer 907 and the metal layer 909 may be stacked as discussed above with respect to FIG. 4A.

A-Si 911 may be formed upon TiN by using a thermal decomposition method or CVD method. In particular, amorphous silicon may be formed on a structure by adsorbing an aminosilane onto the structure by heating the structure and supplying an amino silane-based gas to the heated structure, forming the amorphous silicon film on the structure onto which the aminosilane is adsorbed by heating the structure and supplying a silane-based gas containing no amino group on the heated structure onto which the aminosilane is adsorbed, and etching the amorphous silicon film to decrease a film thickness of the amorphous silicon film.

The SiN hard mask 913 is deposited upon the a-Si 911 and the Si hard mask 915 is deposited upon the SiN hard mask 915.

Spacers 917 are formed on top of the Si hard mask 915. In an exemplary implementation, the process employs self-aligned quadruple patterning (SAQP) to form the BLs.

Si and SiN etching, with the spacer 917 as a mask, is performed using reactive ion etching (RIE) in the etching system of FIG. 2, to form strips of SiN 913 tipped with Si 915, as shown in FIG. 9B. The a-Si 911 is then etched using the SiN hard mask 913, resulting in the structure shown in FIG. 9C. In exemplary processes, Si and SiN etching may be performed by a dry plasma etching process or a wet etching process.

Figures 10A, 10B, 10C, 10D:
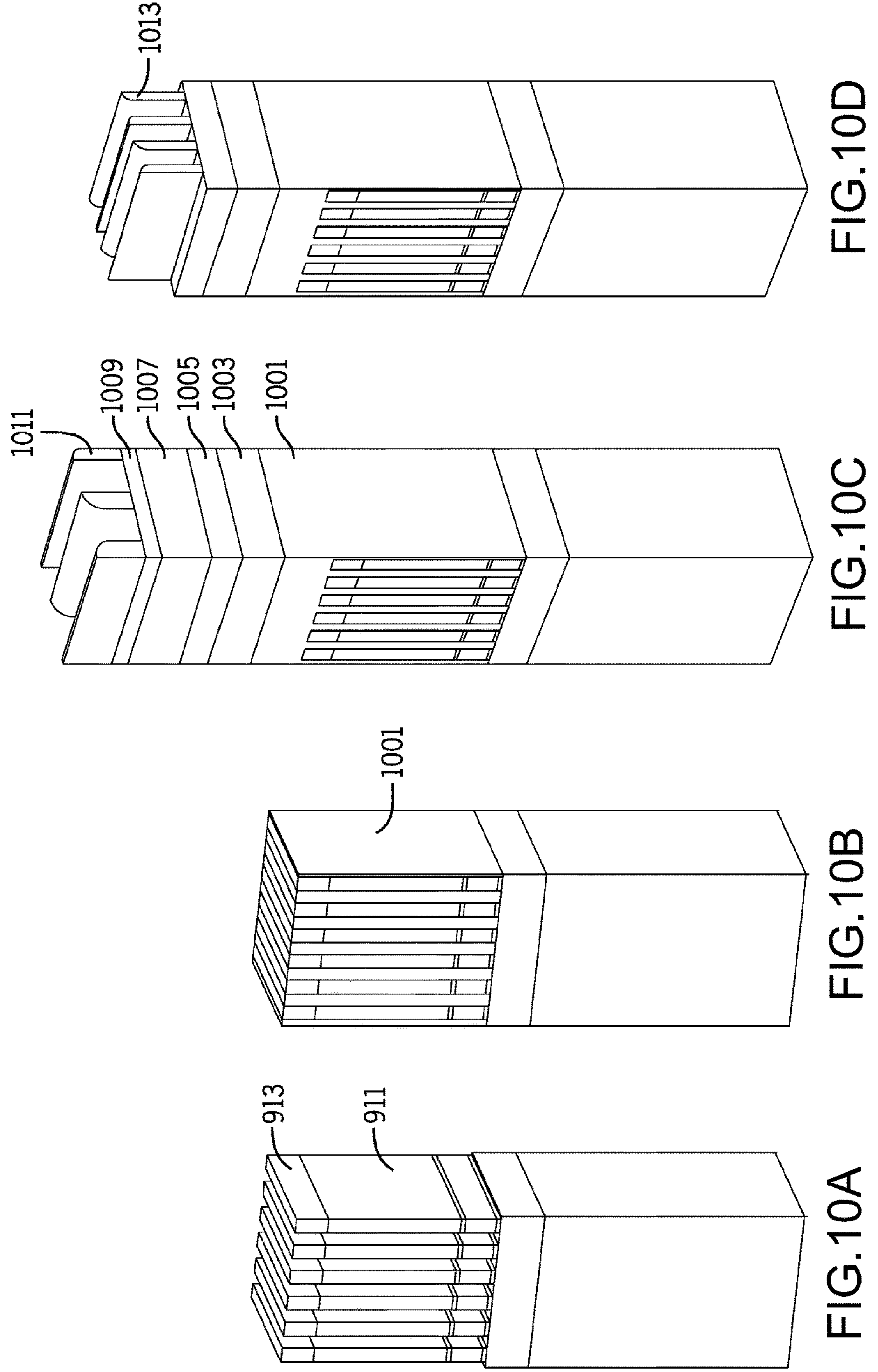
FIG. 10A is a structure of partially fabricated 4F2 memory cells, during self-aligned BL etch, after the processes described in FIG. 9C have been completed.
FIG. 10B is a structure of partially fabricated 4F2 memory cells during SOH fill, after the processes described in FIG. 10A have been completed.
FIG. 10C is a structure of partially fabricated 4F2 memory cells during 1st spacer deposition and etch, after the processes described in FIG. 10B have been completed.
FIG. 10D is a structure of partially fabricated 4F2 memory cells during 2nd spacer deposition and etch, after the processes described in FIG. 10C have been completed.

FIG. 10A shows the resulting structure after a self-aligned BL etch is performed to etch through the metal layer 905, the metal layer 907 and the metal layer 909 stacked layers. As a result, bit lines (BLs) including the metal layer 905, the metal layer 907, and the metal layer 909 are formed.

Subsequently, as shown in FIG. 10B, an oxide 1001 (SOH) fill is performed followed by an etch back. In particular, the oxide 1001 is filled between the plates of the 3D structure. The oxide 1001 is filled by CVD or spin-on processes. The oxide 1001 may be removed by a plasma etching processes.

Next, another SAQP process is performed with features (e.g., photoresist) formed orthogonal to the direction of the BLs. SOH 1001, Si HM 1003, SiN HM 1005, SOH 1007, SiON 1009, first spacers 1011 and second spacers 1013 are deposited and etched in a similar way that is discussed in FIGS. 9A-9C.

Figures 11A, 11B, 11C, 11D:
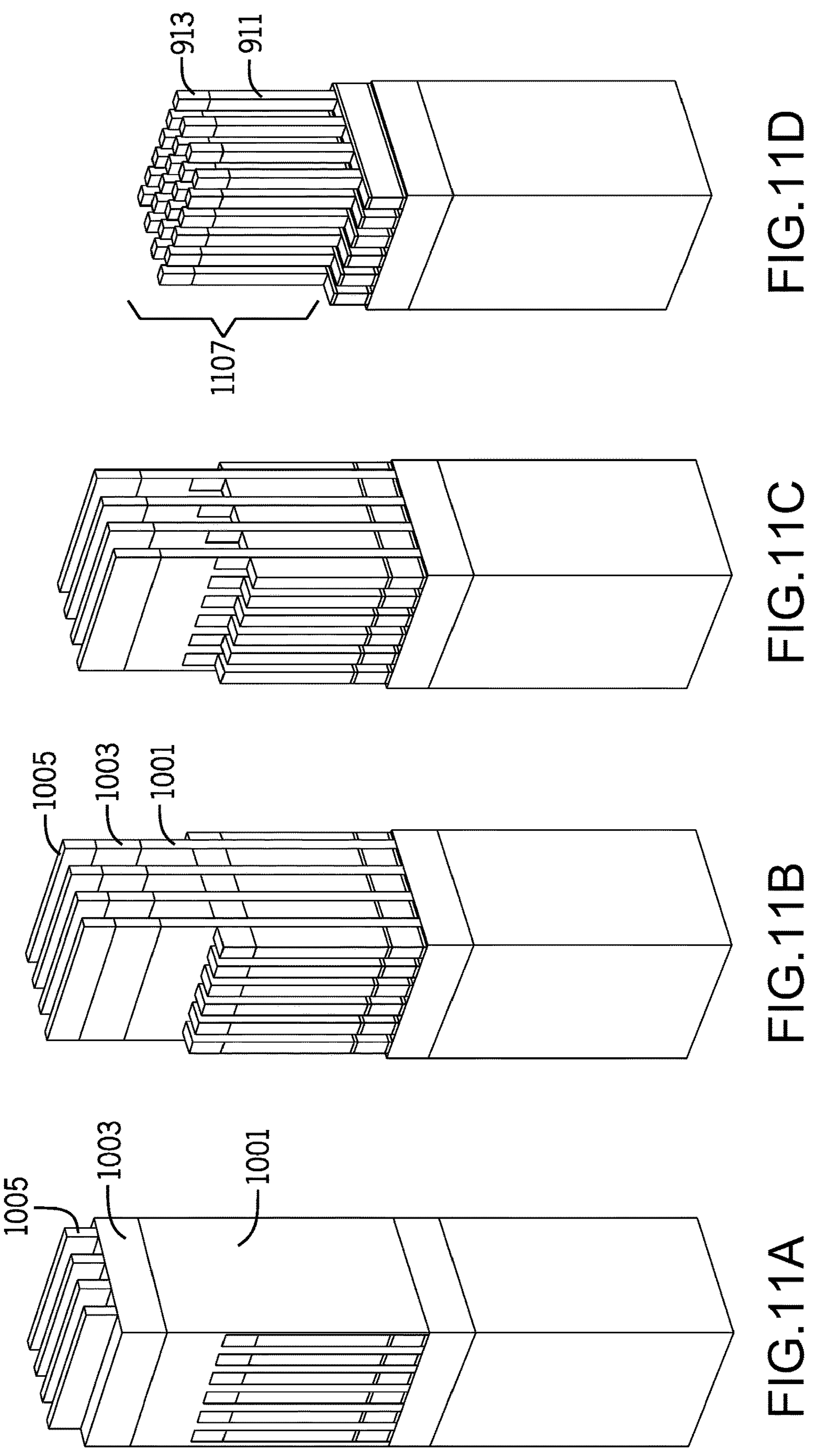
FIG. 11A is a structure of partially fabricated 4F2 memory cells during HM etch and oxide strip, after the processes described in FIG. 10D have been completed.
FIG. 11B is a structure of partially fabricated 4F2 memory cells SOH etch, after the processes described in FIG. 11A have been completed.
FIG. 11C is a structure of partially fabricated 4F2 memory cells during HM etch, after the processes described in FIG. 11B have been completed.
FIG. 11D is a structure of partially fabricated 4F2 memory cells during Si etch for pillar formation, after the processes described in FIG. 11C have been completed.

FIG. 11A shows the structure with SiN HM 1005 and Si HM 1003 exposed after successive processes of SiN hard mask etching and oxide stripping. The strips of SiN HM 1005 serve as an etch block to create a precursor to pillar formation of the 3D semiconductor structure.

Then, Si hard mask etching is performed to remove Si HM 1003 and then SOH etching is performed to remove all exposed SOH 1001 except for regions shaded by Si HM 1003, resulting in the structure shown in FIG. 11B. Note that the SOH 1001 between the pillars including a-Si 911 and SiN hard mask 913 is removed as well as the SOH between the rows of bit lines including the metal layer 905, the metal layer 90,7 and the metal layer 909. Then, a process of SiN HM etching is performed to remove all exposed SiN HM. SiN HM layers 1005 and 913 are removed, as shown in the resulting structure of FIG. 11C.

Then, a process of Si etching is performed to form the pillar structure shown in FIG. 11D. The pillar structure shown in FIG. 11D includes an array of sacrificial vertical pillars 1107, and each sacrificial vertical pillar 1107 includes a-Si 911 with a layer of SiN HM 913 on top of the a-Si 911.

Figures 12A, 12B, 12C:
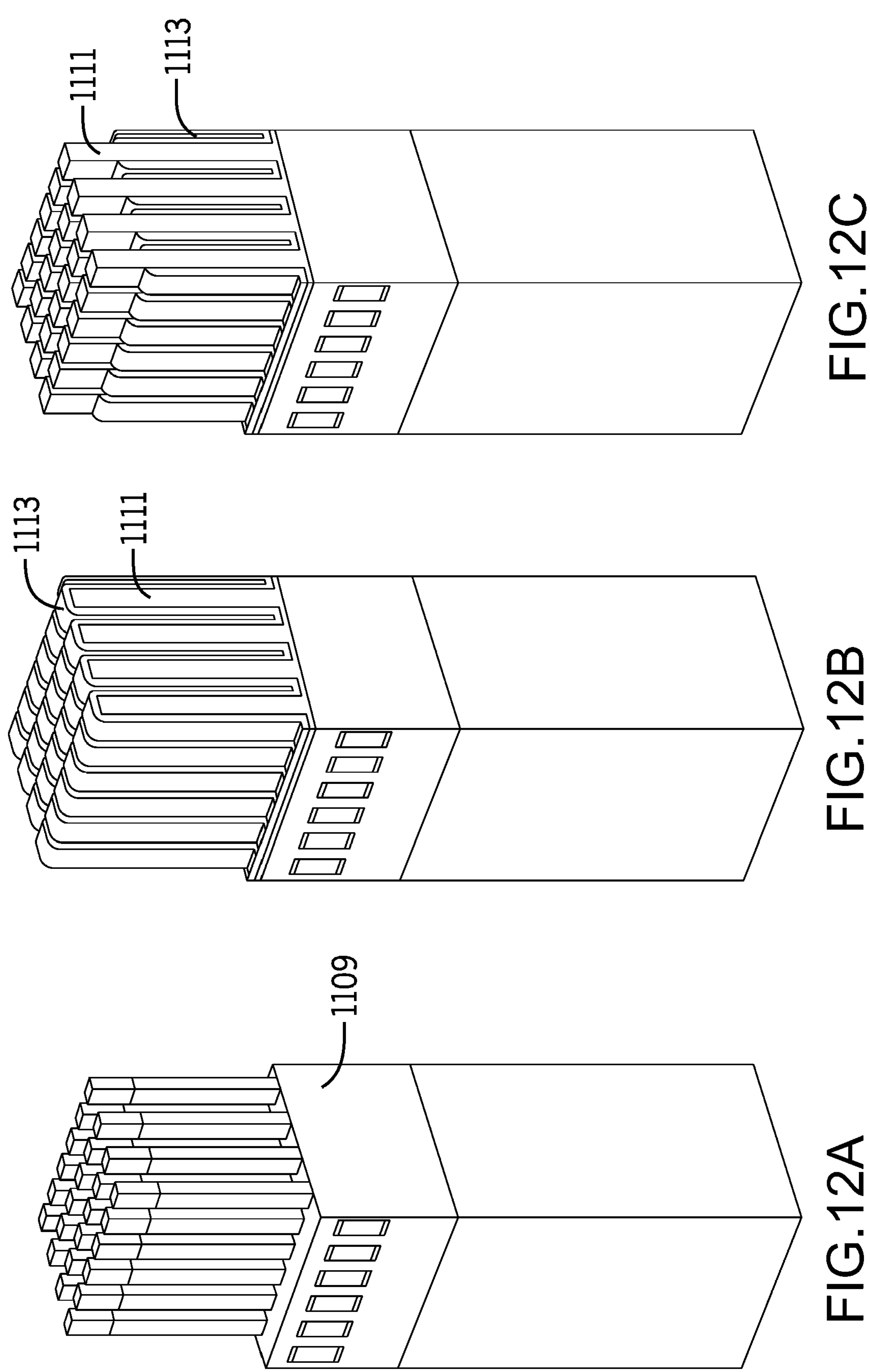
FIG. 12A is a structure of partially fabricated 4F2 memory cells during oxide recess, after the processes described in FIG. 11D have been completed.
FIG. 12B is a structure of partially fabricated 4F2 memory cells during gate oxide deposition and metal gate deposition, after the processes described in FIG. 12A have been completed.
FIG. 12C is a structure of partially fabricated 4F2 memory cells during metal gate etch and recess to define gate length, after the processes described in FIG. 12B have been completed.

FIGS. 12A-12C show profile views of the structure. After performing an oxide deposition and CMP, FIG. 12A shows a structure after an oxide recess to define a gate offset between the BL and a gate to be formed later. The resulting structure in FIG. 12A include an oxide 1109 that encases the bit lines with sacrificial vertical pillars 1107 (FIG. 11D) emerging therefrom.

Subsequently successive steps are performed of forming a gate oxide 1111 (for example SiO2, SiON, Ta2O5, Ba1−xSrxTiO3 (BST) on exposed surfaces of the vertical pillars 1107 and the oxide 1109, followed by a gate metal (e.g., TiN) 1113 over the gate oxide 1111. The resulting intermediate structure is shown in FIG. 12B. The gate metal 1113 is then etched back so as to expose gate oxide 1111, and define a gate length Lg, and provide an intermediate structure, as shown in FIG. 12C. In FIG. 12C, the gate metals 1113 are continuous between adjacent vertical pillars 1107 in a direction orthogonal to the bit line direction to form word lines while isolated between adjacent vertical pillars 1107 in the bit line direction.

Figures 13A, 13B, 13C, 13D:
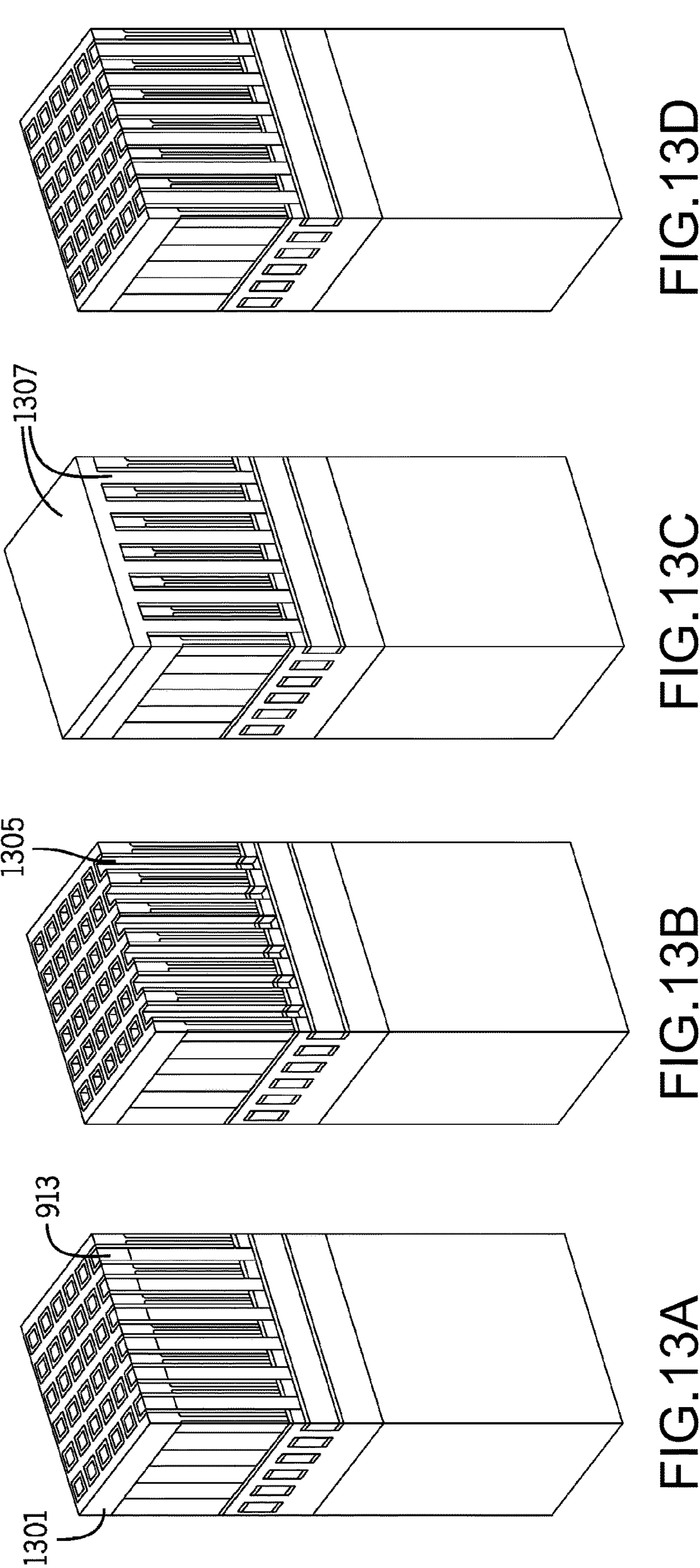
FIG. 13A is a structure of partially fabricated 4F2 memory cells during oxide fill and planarization, after the processes described in FIG. 12C have been completed.
FIG. 13B is a structure of partially fabricated 4F2 memory cells during removal of sacrificial poly-Si, after the processes described in FIG. 13A have been completed.
FIG. 13C is a structure of partially fabricated 4F2 memory cells during IGZO deposition, after the processes described in FIG. 13B have been completed.
FIG. 13D is a structure of partially fabricated 4F2 memory cells during IGZO etch back or planarization, after the processes described in FIG. 13C have been completed.

Then, the structure shown in FIG. 13A is formed after successive steps of oxide deposition to encase the vertical pillars in an oxide 1301 and CMP to flatten the top of the structure and expose the gate oxide 1111, and the SiN HM 913 on the edge of the 3D structure.

FIG. 13B shows a cross section of the 3D structure after an SiN insulator/mask 913 is removed, leaving a pillar void 1305 at the top of each pillar with gate oxide 1111 edges defining the boundary of the void 1305. In an exemplary implementation, the SiN hard mask is removed via hot H3PO4, and then the remaining Si sacrificial vertical pillar is removed.

Next, oxide semiconductor such as IGZO is deposited via ALD or CVD, resulting in the structure shown in FIG. 13C. Oxide semiconductor 1307 is deposited to fill each pillar void 1305. As shown in FIG. 13D, the top layer of IGZO is removed via etching or planarization CMP.

Figures 14A, 14B, 14C, 14D:
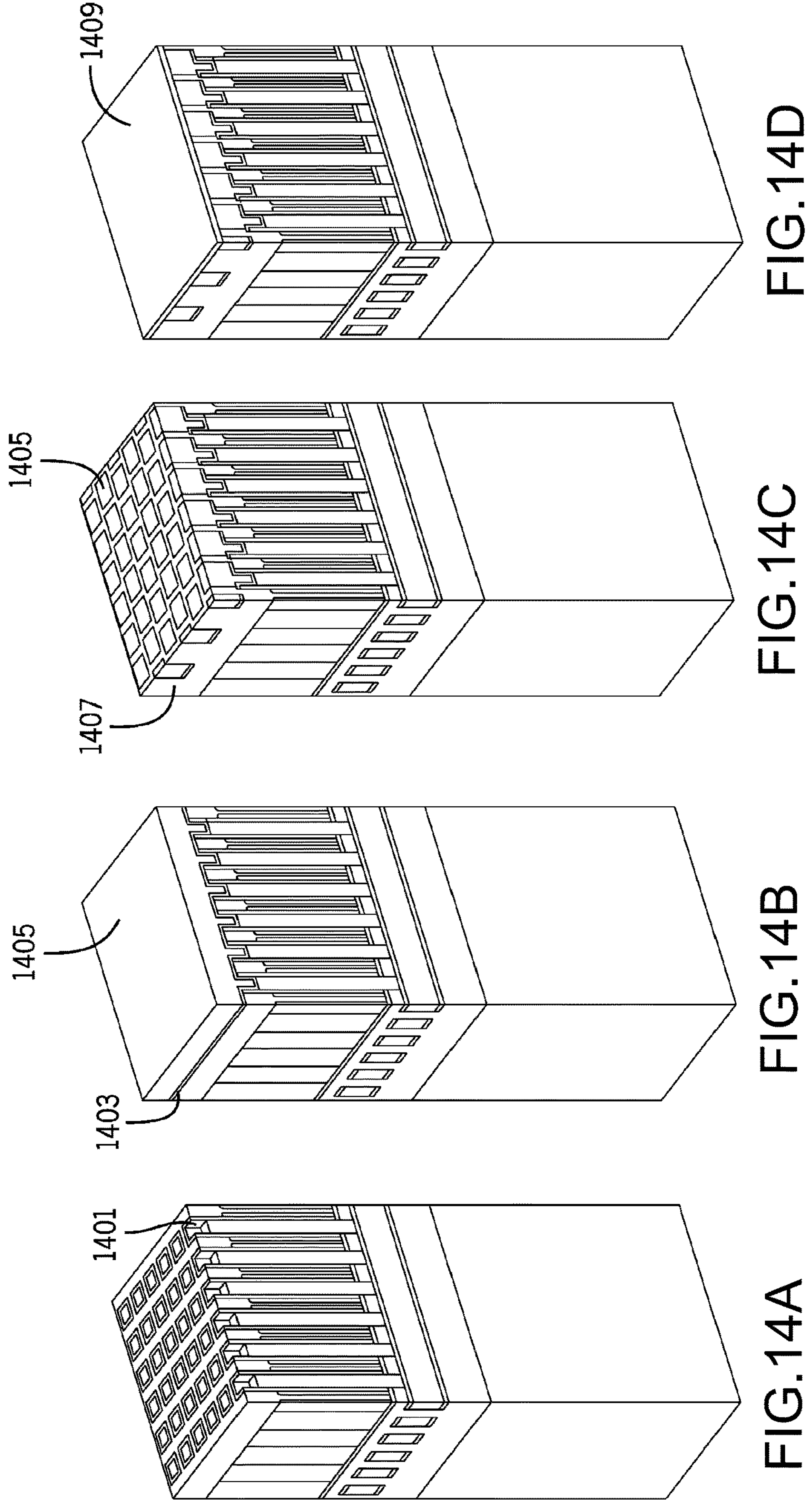
FIG. 14A is a structure of partially fabricated 4F2 memory cells during IGZO recess, after the processes described in FIG. 13D have been completed.
FIG. 14B is a structure of partially fabricated 4F2 memory cells during metal deposition, after the processes described in FIG. 14A have been completed.
FIG. 14C is a structure of partially fabricated 4F2 memory cells during landing pad patterning and oxide fill, after the processes described in FIG. 14B have been completed.
FIG. 14D is a structure of partially fabricated 4F2 memory cells during etch stop prior to contact formation, after the processes described in FIG. 14C have been completed.

In FIG. 14A, gate offsets 1401 are formed in the IGZO structures to define a gate offset between a landing pad electrode 1403 (e.g., TiN) and the gate metal 1113. The landing pad electrode 1403 deposition followed by metal (W) 1405 deposition is shown in FIG. 14B.

Subsequently, landing pad patterning is performed followed by an oxide fill 1407 and/or planarization (CMP) as shown in FIG. 14C. In particular, a patterned hard mask is formed over metal 1405, and then an etched pattern in metal 1405 is formed via an etching. The hard mask is removed and then the exposed pattern in metal 1405 is filled with oxide fill 1407.

Subsequently, as shown in FIG. 14D, an etch stopper 1409 (e.g., SiBN) is deposited as a top layer.

Figures 15A, 15B, 15C:
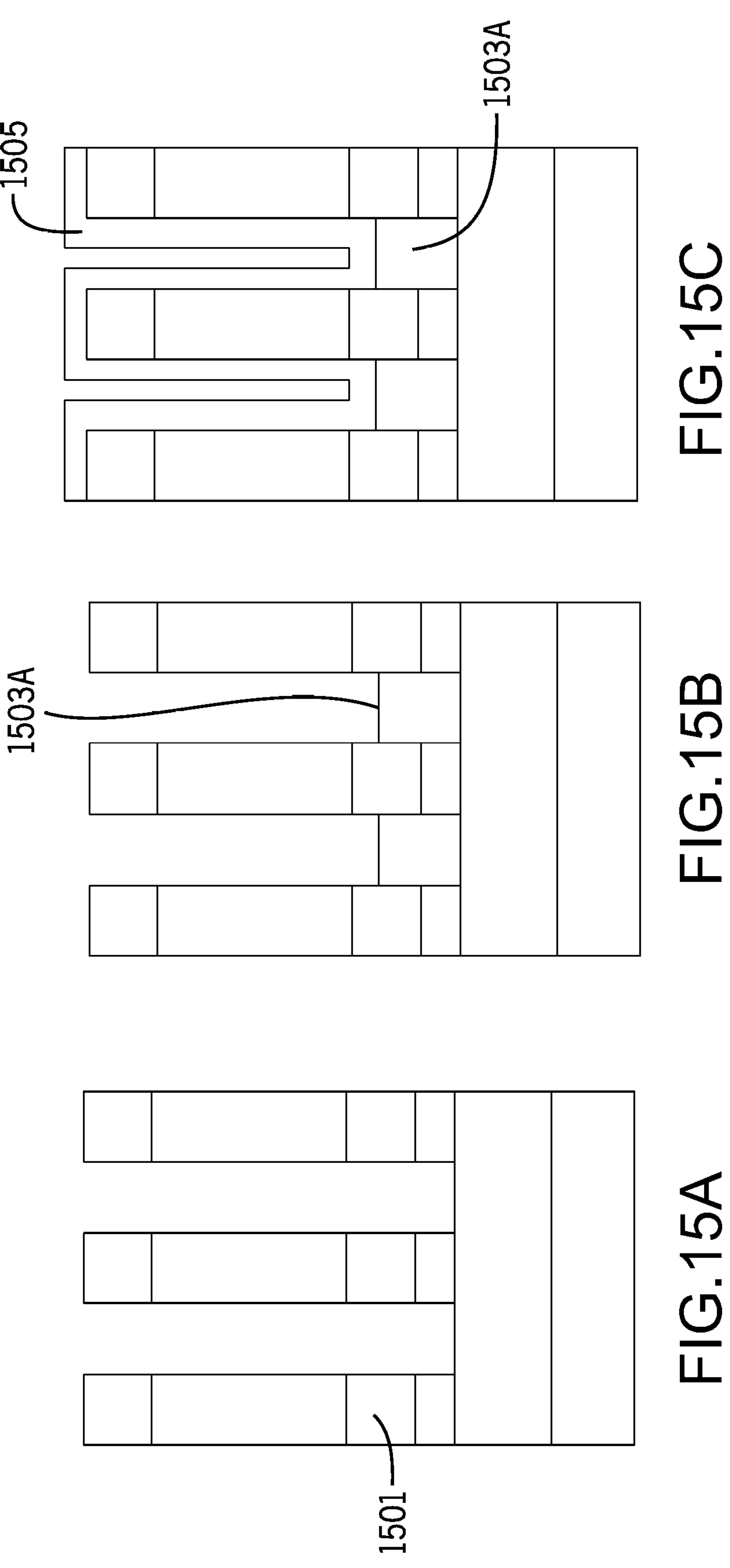
FIG. 15A is a cross-section of three vertical plates of partially fabricated 4F2 memory cells according to a modification of the first and second embodiments.
FIG. 15B is a cross-section of three vertical plates of partially fabricated 4F2 memory cells according to the modification of the first and second embodiments where a gap between pillars and bit lines is filled with a polymer, and then etched back in a lower portion between respective bit lines.
FIG. 15C is a cross-section of three vertical plates shown in FIG. 15B with a partial oxide fill between respective vertical plates.

4F2 Structure with Air Gap Resulting from a Process Using a Polymer Having a Urea Bond FIGS. 15A-15C show a structure that is arranged to provide an air gap between bit lines 1501, and is employed as an optional modification to the processes/structures of the first and second embodiments. In particular, FIG. 15A shows a cross-section of three vertical pillars of oxide semiconductor or sacrificial material partially fabricated 4F2 memory cells according to a modification of the first and second embodiments. The bit lines 1501 are the relevant structure in FIG. 15A. FIG. 15B shows a cross-section of three vertical pillars of partially fabricated 4F2 memory cells according to the modification of the first and second embodiments where a trench between pillars and BLs 1501 is filled with a polymer 1503A, and then etched back in a lower portion between respective BLs 1501. The polymer 1503A may be a urea binder resin (polyurea) that can be removed by heat treatment (e.g., 450° C. or below). Moreover, by applying thermal energy during the heat treatment, the thermally decomposed material is depolymerized and removed from the substrate. FIG. 15C shows a cross-section of three capacitor pillars shown in FIG. 15C with a partial oxide fill 1505 between respective vertical capacitors.

The structure shown in FIG. 15A corresponds to the structure in FIG. 4B or the structure in FIG. 10A. A polymer 1503A, as discussed above, is deposited to fill a gap between vertical projections including BL 1501, oxide semiconductor or a sacrificial material, and cover the SiN hard mask. The polymer may be formed or deposited using CVD method. Additional systems, such as chemical mechanical polish (CMP) systems, physical layer deposition (PLD) systems, and the like may be used as well.

The polymer 1503A is then etched back so that the bottom of the gap, between bit lines 1501, is the only region that remains filled with the polymer 1503A, which is shown in FIG. 15B. The polymer may be etched by performing dry etching or, for example, reactive ion etching (RIE).

An oxide 1505, such as SiO2, SiON, Ta2O5, Ba1−xSrxTiO3 (BST) is then deposited on the sidewalls of the vertical projections, and on top of the polymer 1503A as shown in FIG. 15C.

Figures 16A, 16B:
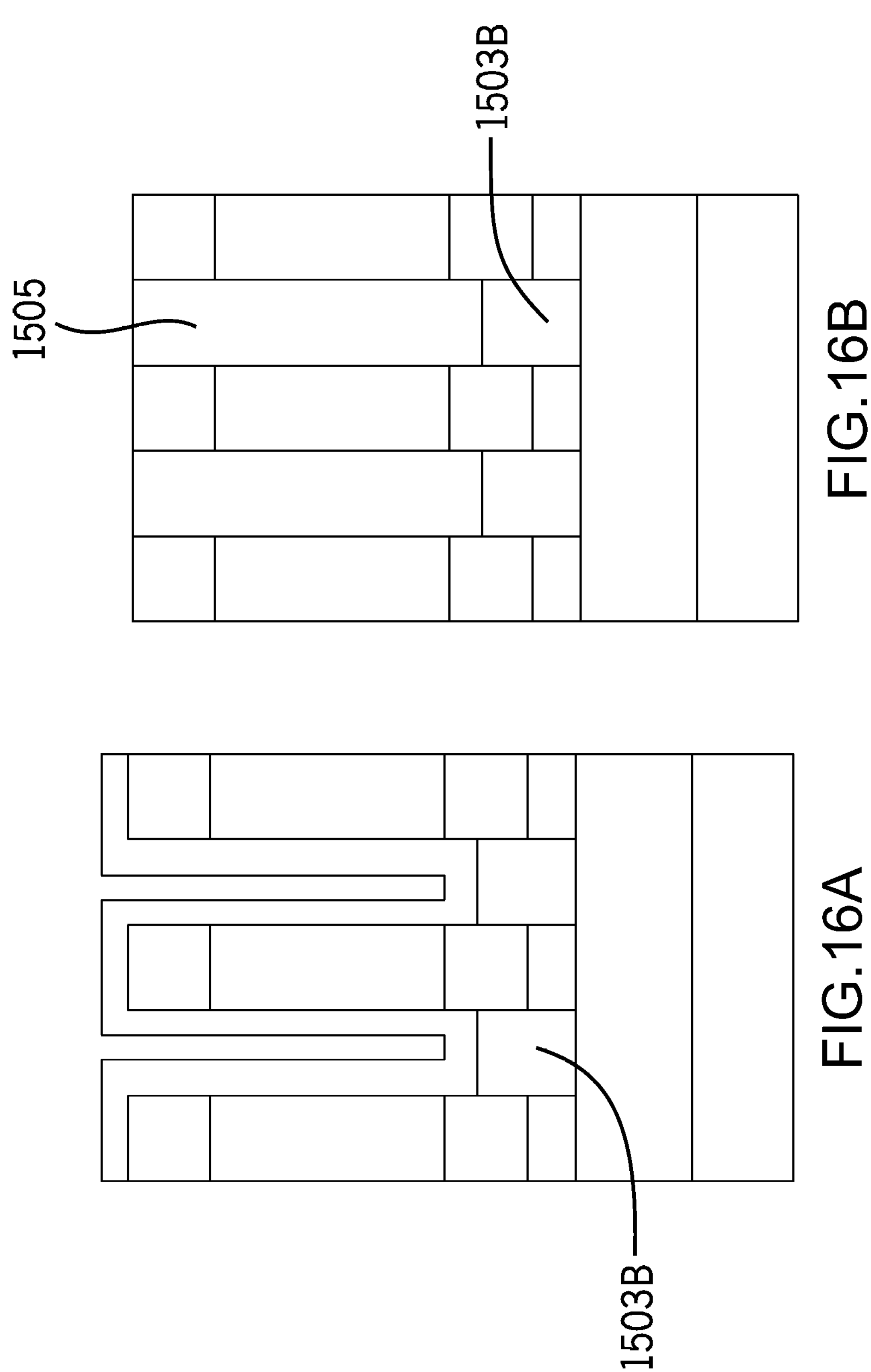
FIG. 16A shows the structure of FIG. 15C with the residual polymer material removed and a remaining air gap is formed between respective bit lines.
FIG. 16B shows the structure of FIG. 16A with remaining gap between vertical plates fully filled with oxide.

FIG. 16A shows the structure of FIG. 15C with the residual polymer material having been removed and a remaining air gap 1503B is formed between respective bit lines. FIG. 16B shows the structure of FIG. 16A with remaining gap between vertical projections fully filled with oxide (e.g., SiO2 or SOH).

In FIG. 16A, the polymer 1503A is removed from the structure, leaving an air gap 1503B between the vertical projections and below the oxide 1505. In exemplary processes, the polymer may be removed by a thermal heating process, dry etching or RIE. In an exemplary implementation in which the polymer includes a urea binder resin or polyurea, such polymer may be removed by a thermal process and does not need plasma ashing or RIE.

Next, additional oxide is applied to fill any gaps that remain above the layer of oxide 1505, but oxide is not applied to air gap 1503B. The additional oxide may be etched back so that oxide 1505 does not cover the vertical pillars, as shown in FIG. 16B. The resulting structure is an alternative structure corresponding to the structure in FIG. 5A or the structure in FIG. 10B, and the subsequent processes are applicable in a similar manner to the above. The resulting structure where the adjacent bit lines 1501 are separated with air gap 1503B and provides improved bit line isolation or reduced parasitic capacitance.

The polymer 1503A having a urea bond may formed by a reaction of two reactants that polymerize. For example, a polymer having urea bond can be formed by copolymerization of isocyanate and amine. For example, an alicyclic compound or an aliphatic compound may be used as the amine. The alicyclic compound may include, for example, 1,3-bis (aminomethyl)cyclohexane. The aliphatic compound may include, for example, 1,12-diaminododecane. For example, an alicyclic compound, an aliphatic compound, an aromatic compound or the like can be used as the isocyanate. The alicyclic compound may include, for example, 1,3-bis (isocyanatomethyl)cyclohexane and the aliphatic compound may include, for example, hexamethylene diisocyanate. The polymer 1503A having a urea bond can then be depolymerized by heat. Thus, in a first step, a first and a second reactant are vaporized at a temperature below 250° C. and applied to a reaction chamber and form a polymer 1503A on the substrate via CVD, as shown in FIG. 15B. Then the substrate is exposed to heat (e.g., higher than 250° C., for example in a range of 250° C. to 325° C.) to depolymerize (anneal) the polymer and thus form an air gap 1503B where the polymer was initially located, as shown in FIG. 16A. More detailed explanations of a polymer 1503A having a urea bond are found in Japanese patent publication JP2018107427A, filed Oct. 27, 2017, JP2019104963A, filed in the Japanese Patent Office Dec. 12, 2017, and US patent publication 2020/0152475, filed in the USPTO on Jan. 17, 2020, and US patent publication 2018/0025917 the entire contents of each of which being incorporated herein by reference.

While each of the embodiments have been described separately, it should be understood that the embodiments may be combined. For example, considering Self-aligned pillar with BL as embodiment 1, replacement IGZO as embodiment 2, and BL isolation by air gap as embodiment 3, additional embodiments include combinations of the above, such as embodiment 1 combined with embodiment 3 and embodiment 2 with embodiment 3, for example.

Figure 17:
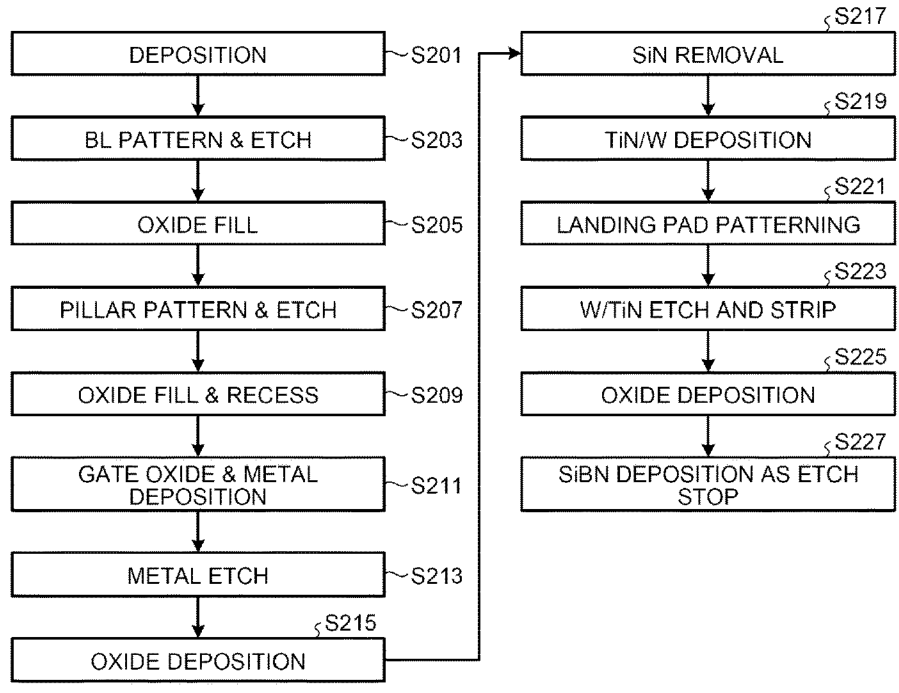
FIG. 17 is a flow chart of a manufacturing process for making 4F2 memory cells according to the first embodiment.

FIG. 17 is a flow chart of a manufacturing process for making 4F2 memory cells according to the first embodiment. The manufacturing process of FIG. 17 begins at step S201, in which layered deposition is performed. In particular, an Si substrate 401 is deposited. Successive layers of the dielectric layer 403, the metal layer 405, and the metal layer 407 (e.g., tungsten, W) are then formed. In an exemplary implementation, the metal layer 405 is a thin barrier layer to separate the dielectric layer 403 from the metal layer 407. Oxide semiconductor 409 is deposited upon metal layer 407, insulating film 411 is deposited on the oxide semiconductor 409 and then a hard mask 413, such as SiN, is deposited on insulating film 411. The stacked structure of deposited layers is shown in FIG. 4A.

In step S203, etching is performed. FIG. 4B shows the structure after SiN and IGZO etching to provide vertical plates 415. In an exemplary implementation, an etching gas containing CH4 and/or a Cl-containing etch gas (e.g., Cl2 or Bl13), and/or an F-containing etch gas (such as CF4) may be used to etch the IGZO. The vertical plates 415 are created after the W/TiN etch so as to create self-aligned BLs in the metal layer 405 containing the W/TiN material.

In step S205, an oxide material 417 is filled between the vertical plates 415, as shown in FIG. 5A. In an exemplary implementation, the oxide material 417 may be SiO2 or SOH, but other oxide materials may be used.

In step S207, the intermediate structure of FIG. 5A including vertical plates 417 and the oxide material 417 is etched to form pillars, as shown in FIGS. 5B-5D. In particular, a mask material 419 is disposed upon the intermediate structure (see FIG. 5B) via photolithography. The mask material 419 is formed in strips across the structure in a direction orthogonal to the vertical plates 415. These mask strips 419 serve as an etch block to create a precursor to pillar formation of the 3D semiconductor structure.

An etch is performed on the structure, except for the areas covered by the mask material 419, and a resulting structure is shown in FIG. 5C. Then, an IGZO and SiO2 etch is performed, and intermediate vertical pillars 422 are formed with IGZO remnants (415) capped with insulating film remnants (411) of the vertical plates 415, as shown in FIG. 5D.

In step S209, the 3D structure from FIG. 5D is filled with oxide (e.g., O2 or SiO2) 423. A chemical mechanical planarization (CMP) step may be performed to remove excess materials on the top of the structure and create a smooth surface with exposed insulator material 411 at the top of each buried pillar. Then an oxide recess process is performed, which exposes IGZO/SiN pillars 415/411 that emerge from a SiO2 block 423, as shown in FIG. 6B.

In step S211, a gate oxide 425 is formed on the exposed surfaces of the IGZO/SiN pillars 415/411 and SiO2 block 423. Then, a gate metal (e.g., TiN) 427 is formed over the gate oxide 425. The resulting intermediate structure is shown in FIG. 6C.

In step S213, the gate metal 427 is etched back so as to expose gate oxide 425, and define a gate length Lg, and provide an intermediate structure, as shown in FIG. 7A.

In step S215, an oxide deposition process is performed to encase the vertical pillars in oxide, as shown in FIG. 7B. CMP may be performed to flatten a top of the resulting structure and expose the gate oxide 425 and insulating film 411.

In step S217, a process is performed to remove an SiN insulator/mask is removed, which is shown in the cross section of memory cells in FIG. 7C. After removal of the SiN insulator/mask 411, a void 429 remains at the top of each pillar with gate oxide 425 edges defining the boundary of the void 429.

In step S219, a metal 431 (e.g., TiN or W) is deposited on a top of the 3D structure. In particular, gate metal 427 (WL) is about the IGZO for each pillar (formerly vertical plate 415) and is separated by oxide 423. Metal 431 is formed on top of the structure. Thus, the BLs are self-aligned with the IGZO channels. In an exemplary implementation, metal 431 is W/TiN, but other material compositions may be utilized.

In step S221, hard mask 433 is patterned over each pillar, as shown in FIG. 8A.

In step S223, an etch and strip process is performed to expose metal contacts 435 for each pillar, as shown in FIG. 8B. The metal contacts 435 are etched from metal 431.

In step S225, an oxide deposition is performed to encase the vertical pillars including metal contacts 435 in oxide. CMP may be performed to flatten a top of the resulting structure and expose the top surface of metal contacts 435.

In step S227, an SiBN deposition is performed to form an etch stopper 437 on top of the vertical pillars, as shown in FIG. 8C.

Figure 18:
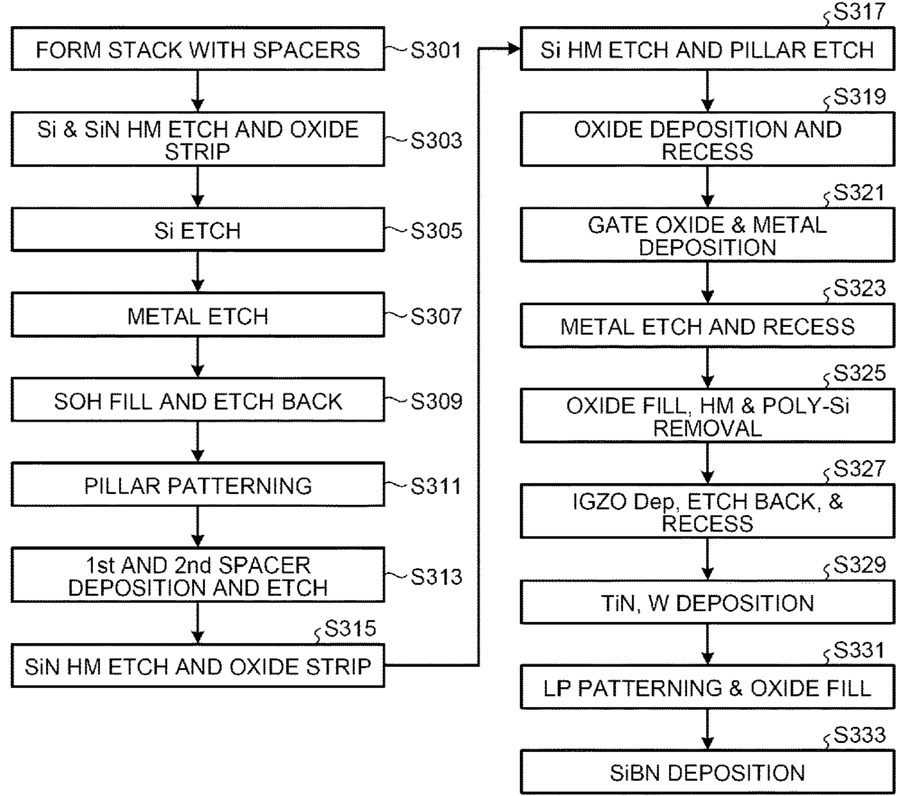
FIG. 18 is a flow chart of a manufacturing process for making 4F2 memory cells according to the second embodiment.

FIG. 18 is a flow chart of a manufacturing process for making 4F2 memory cells according to a second embodiment.

In step S301, a stacked structure is formed. In an exemplary implementation, layers of a Si substrate 901, the dielectric layer (e.g. SiO2) 903, the metal layer 905, the metal layer 907, the metal layer 909, a-Si 911, SiN hard mask 913 and Si hard mask 915 are stacked upon each other. First and second spacers 917 are formed on top of Si hard mask 915. For example, SOH, SiON and photoresist are stacked upon Si hard mask 915. On top of the SiON layer, a spacer 917 that is deposited, as shown in FIG. 9A.

In step S303, Si and SiN HM etching are performed to form an etch pattern used to form a strip of SiN 913 tipped with Si 915 via an oxide strip. In particular, Si etching is first performed to etch Si 915 and then SiN HM etching is performed to etch SiN 913, resulting in the structure shown in FIG. 9B.

In step S305, exposed Si is etched. In particular, the exposed Si 915 is removed by the etching as well as exposed a-Si 911. Pillars of a-Si 911 below SiN hard mask 913 are protected from the etching, resulting in the structure shown in FIG. 9C.

In step S307, a self-aligned BL etch is performed to etch through the metal layer 905, the metal layer 907 and the metal layer 909 stacked layers, resulting in the structure shown in FIG. 10A. In particular, the self-aligned BL etching is performed with SiN hard mask 913 protecting the each pillar, and the metal layer 905, the metal layer 907 and the metal layer 909 stacked layers down to oxide 903.

In step S309, an oxide 1001 (e.g., SOH) is deposited so as to fill the gaps etched away in step S307, as shown in the resulting structure of FIG. 10B.

In step S311, another SAQP photolithography process is performed with features formed orthogonal to the direction of the BLs. In particular, layers are stacked upon the structure resulting from step S309. SOH 1001, Si HM 1003, SiN HM 1005, SOH 1007 and SiON 1009 are deposited as shown in FIG. 10C.

In step S313, first spacers 1011 and second spacers 1013 are deposited and etched in an orthogonal direction of the BLs 907 in a similar way that discussed in FIGS. 9A-9C. First spacers 1011 are deposited and etched as shown in FIG. 10C and then second spacers 1013 are deposited and etched to form resulting structure shown in FIG. 10D.

In step S315, SiN HM etching and oxide stripping is performed. The first and second spacers 1011 and 1013 serve as a mask and exposed SiN hard mask 1005 is removed. This leaves strips of SiN hard mask 1005, as shown in FIG. 11A. The strips of SiN HM 1005 serve as an etch block to create a precursor to pillar formation of the 3D semiconductor structure. Oxide stripping is performed to remove all exposed oxide 1001, resulting in the structure shown in FIG. 11B. Note that the SOH 1001 between the pillars including a-Si 911 and SiN hard mask 913 is removed as well as the SOH between the rows of the metal layer 907 and the metal layer 909.

In step S317, a process of SiN HM etching is performed to remove all exposed SiN HM. SiN HM layers 1005 and 913 are removed, as shown in the resulting structure of FIG. 11C. Then, a process of Si pillar etching is performed. Leftover layers of Si 1003, oxide 1001 and a-Si (not protected by SiN 913 and a-Si 911) are removed in this etching step, resulting in the pillar structure shown in FIG. 11D. The pillar structure shown in FIG. 11D includes an array of sacrificial vertical pillars 1107, and each sacrificial vertical pillar 1107 includes a-Si 911 and SiN HM 913 on top of the a-Si 911.

In step S319, an oxide 1109 is deposited and CMP is performed. In particular, an oxide 1109 is deposited and which covers the metal layer 905, the metal layer 907 and the metal layer 909. Additionally, oxide 1109 is deposited between rows of the metal layer 907 and the metal layer 909. CMP may be performed to define a gate offset between the metal layer 907 and a gate to be formed in next steps. The resulting structure is shown in FIG. 12A.

In step S321, gate oxide 1111 is deposited on exposed surfaces of the pillars 1107 and oxide 1109. Then, gate metal 1113 is deposited over the gate oxide 1111, as shown in the intermediate structure of FIG. 12B.

In step S323, the gate metal 1113 is etched so as to expose gate oxide 1111, and define a gate length Lg, as shown in FIG. 12C.

In step S325, an oxide deposition process is performed to encase the vertical pillars in oxide. CMP is performed to flatten the top of the resulting structure and expose gate oxide 1111, SiN hard mask 913, as shown in FIG. 13A. Then, SiN insulator/mask 913 is removed, leaving a pillar void 1305 at the top of each pillar with gate oxide 1301 edges defining the boundary of the pillar void 1305. This resulting structure is shown in FIG. 13B. In an exemplary implementation, the SiN hard mask is removed via hot H3PO4, and then the remaining Si sacrificial vertical pillar is removed.

In step S327, oxide semiconductor 1307 is deposited, resulting in the structure shown in FIG. 13C. The oxide semiconductor 1307 is deposited within each pillar separated by the oxide, filing each pillar void 1305. In an exemplary implementation, IGZO is deposited via ALD or CVD. The top layer of IGZO is removed via etching or planarization CMP as shown in FIG. 13D. Then, gate offset spaces 1401 are formed as shown in FIG. 14A via depth control RIE etching. Gate offset spaces 1401 are recesses formed in the IGZO structures to define a gate offset between a landing pad and the gate metal.

In step S329, TiN 1403 is deposited followed by metal (W) 1405 being deposited as shown in FIG. 14B.

In step S331, landing pad patterning is performed followed by an oxide fill 1407 and/or planarization (CMP) as shown in FIG. 14C. In particular, a patterned hard mask is formed over metal 1405, and then an etched pattern in metal 1405 is formed via an etching. The hard mask is removed and then the exposed pattern in metal 1405 is filled with oxide fill 1407.

In step S333, an etch stopper 1409 is deposited as a top layer as shown in FIG. 14D.

Figure 19:
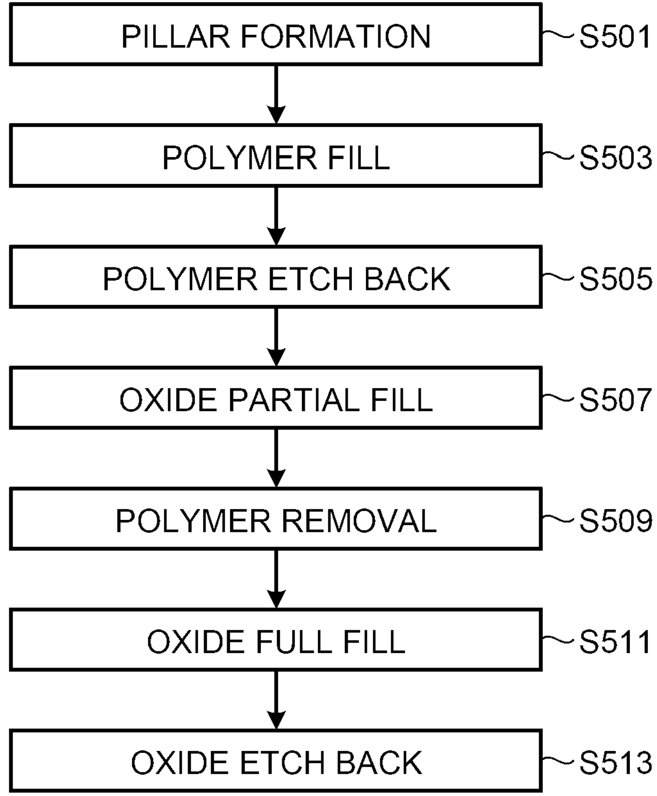
FIG. 19 is a flow chart of a manufacturing process for making 4F2 memory cells with the air gap according to the modification of the first and second embodiments as described in FIGS. 15A-16B.

FIG. 19 is a flow chart of a manufacturing process for making 4F2 memory cells with the air gap described in FIGS. 15A-16B.

In step S501, the vertical pillars are formed as in the first and second embodiments.

In step S503, polymer 1503A is applied to the pillar formation to fill between the vertical pillars. As an example, a first and a second reactant may be vaporized in a reaction chamber, and to then form polymer 1503A on the pillar formation via CVD. However, polymer 1503A may be applied to the pillar formation via another method such as ALD.

In step S505, the polymer 1503A is etched back so that the bottom of the gap, between BLs 1501, is the only region that remains filled with the polymer 1503A. Such a structure is shown in FIG. 15B.

In step S507, oxide 1505 is applied to the pillar formation to at least partially fill in the gap between vertical pillars above polymer 1503A. In an exemplary implementation, the oxide 1505 is deposited on the sidewalls of the vertical pillars and on top of the polymer 1503A, as shown in FIG. 15C.

In step S509, polymer 1503A is removed from the pillar formation. For example, the substrate may be exposed to heat to depolymerize (anneal) the polymer 1503A so that the polymer 1503A may be removed, which forms air gap 1503B where the polymer 1503A was initially located.

In step S511, additional oxide may be applied to the pillar formation to fill any gaps in the oxide layer of oxide 1505. Then, in step S513, oxide 1505 may be etched back so that oxide 1505 does not overlap the vertical pillars, as shown in FIG. 16B.

Control System Including Control Circuitry

FIG. 20 illustrates a block diagram of a computer that may implement the various embodiments described herein.

The present disclosure may be embodied as a system, a method, and/or a computer program product. The computer program product may include a computer readable storage medium on which computer readable program instructions are recorded that may cause one or more processors to carry out aspects of the embodiment.

The computer readable storage medium may be a tangible device that can store instructions for use by an instruction execution device (processor). The computer readable storage medium may be, for example, but is not limited to, an electronic storage device, a magnetic storage device, an optical storage device, an electromagnetic storage device, a semiconductor storage device, or any appropriate combination of these devices. A non-exhaustive list of more specific examples of the computer readable storage medium includes each of the following (and appropriate combinations): flexible disk, hard disk, solid-state drive (SSD), random access memory (RAM), read-only memory (ROM), erasable programmable read-only memory (EPROM or Flash), static random access memory (SRAM), compact disc (CD or CD-ROM), digital versatile disk (DVD) and memory card or stick. A computer readable storage medium, as used in this disclosure, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described in this disclosure can be downloaded to an appropriate computing or processing device from a computer readable storage medium or to an external computer or external storage device via a global network (i.e., the Internet), a local area network, a wide area network and/or a wireless network. The network may include copper transmission wires, optical communication fibers, wireless transmission, routers, firewalls, switches, gateway computers and/or edge servers. A network adapter card or network interface in each computing or processing device may receive computer readable program instructions from the network and forward the computer readable program instructions for storage in a computer readable storage medium within the computing or processing device.

Computer readable program instructions for carrying out operations of the present disclosure may include machine language instructions and/or microcode, which may be compiled or interpreted from source code written in any combination of one or more programming languages, including assembly language, Basic, Fortran, Java, Python, R, C, C++, C #or similar programming languages. The computer readable program instructions may execute entirely on a user's personal computer, notebook computer, tablet, or smartphone, entirely on a remote computer or compute server, or any combination of these computing devices. The remote computer or compute server may be connected to the user's device or devices through a computer network, including a local area network or a wide area network, or a global network (i.e., the Internet). In some embodiments, electronic circuitry including, for example, programmable logic circuitry, field-programmable gate arrays (FPGA), or programmable logic arrays (PLA) may execute the computer readable program instructions by using information from the computer readable program instructions to configure or customize the electronic circuitry, in order to perform aspects of the present disclosure.

Aspects of the present disclosure are described herein with reference to flow diagrams and block diagrams of methods, apparatus (systems), and computer program products according to embodiments of the disclosure. It will be understood by those skilled in the art that each block of the flow diagrams and block diagrams, and combinations of blocks in the flow diagrams and block diagrams, can be implemented by computer readable program instructions.

The computer readable program instructions that may implement the systems and methods described in this disclosure may be provided to one or more processors (and/or one or more cores within a processor) of a general purpose computer, special purpose computer, or other programmable apparatus to produce a machine, such that the instructions, which execute via the processor of the computer or other programmable apparatus, create a system for implementing the functions specified in the flow diagrams and block diagrams in the present disclosure. These computer readable program instructions may also be stored in a computer readable storage medium that can direct a computer, a programmable apparatus, and/or other devices to function in a particular manner, such that the computer readable storage medium having stored instructions is an article of manufacture including instructions which implement aspects of the functions specified in the flow diagrams and block diagrams in the present disclosure.

The computer readable program instructions may also be loaded onto a computer, other programmable apparatus, or other device to cause a series of operational steps to be performed on the computer, other programmable apparatus or other device to produce a computer implemented process, such that the instructions which execute on the computer, other programmable apparatus, or other device implement the functions specified in the flow diagrams and block diagrams in the present disclosure.

FIG. 20 is a functional block diagram illustrating a networked system 800 of one or more networked computers and servers. In an embodiment, the hardware and software environment illustrated in FIG. 20 may provide an exemplary platform (control circuitry) for implementation of the software and/or methods according to the present disclosure. Moreover, software configures the control circuitry to perform the control processes described herein including those that control the devices and processes shown in the etching apparatus (or processing chamber) 300 of FIG. 2.

Referring to FIG. 20, a networked system 800 may include, but is not limited to, computer 805, network 810, remote computer 815, web server 820, cloud storage server 825 and compute server 830. In some embodiments, multiple instances of one or more of the functional blocks illustrated in FIG. 20 may be employed.

Additional detail of computer 805 is shown in FIG. 20. The functional blocks illustrated within computer 805 are provided only to establish exemplary functionality and are not intended to be exhaustive. And while details are not provided for remote computer 815, web server 820, cloud storage server 825 and compute server 830, these other computers and devices may include similar functionality to that shown for computer 805.

Computer 805 may be a personal computer (PC), a desktop computer, laptop computer, tablet computer, netbook computer, a personal digital assistant (PDA), a smart phone, or any other programmable electronic device capable of communicating with other devices on network 810.

Computer 805 may include processor 835, bus 837, memory 840, non-volatile storage 845, network interface 850, peripheral interface 855 and display interface 865. Each of these functions may be implemented, in some embodiments, as individual electronic subsystems (integrated circuit chip or combination of chips and associated devices), or, in other embodiments, some combination of functions may be implemented on a single chip (sometimes called a system on chip or SoC).

Processor 835 may be one or more single or multi-chip microprocessors, such as those designed and/or manufactured by Intel Corporation, Advanced Micro Devices, Inc. (AMD), Arm Holdings (Arm), Apple Computer, etc. Examples of microprocessors include Celeron, Pentium, Core i3, Core i5 and Core i7 from Intel Corporation; Opteron, Phenom, Athlon, Turion and Ryzen from AMD; and Cortex-A, Cortex-R and Cortex-M from Arm.

Bus 837 may be a proprietary or industry standard high-speed parallel or serial peripheral interconnect bus, such as ISA, PCI, PCI Express (PCI-e), AGP, and the like.

Memory 840 and non-volatile storage 845 may be computer-readable storage media. Memory 840 may include any suitable volatile storage devices such as Dynamic Random Access Memory (DRAM) and Static Random Access Memory (SRAM). Non-volatile storage 845 may include one or more of the following: flexible disk, hard disk, solid-state drive (SSD), read-only memory (ROM), erasable programmable read-only memory (EPROM or Flash), compact disc (CD or CD-ROM), digital versatile disk (DVD) and memory card or stick.

Program 848 may be a collection of machine readable instructions and/or data that is stored in non-volatile storage 845 and is used to create, manage and control certain software functions that are discussed in detail elsewhere in the present disclosure and illustrated in the drawings. In some embodiments, memory 840 may be considerably faster than non-volatile storage 845. In such embodiments, program 848 may be transferred from non-volatile storage 845 to memory 840 prior to execution by processor 835.

Computer 805 may be capable of communicating and interacting with other computers via network 810 through network interface 850. Network 810 may be, for example, a local area network (LAN), a wide area network (WAN) such as the Internet, or a combination of the two, and may include wired, wireless, or fiber optic connections. In general, network 810 can be any combination of connections and protocols that support communications between two or more computers and related devices.

Peripheral interface 855 may allow for input and output of data with other devices that may be connected locally with computer 805. For example, peripheral interface 855 may provide a connection to external devices 860. External devices 860 may include devices such as a keyboard, a mouse, a keypad, a touch screen, and/or other suitable input devices. External devices 860 may also include portable computer-readable storage media such as, for example, thumb drives, portable optical or magnetic disks, and memory cards. Software and data used to practice embodiments of the present disclosure, for example, program 848, may be stored on such portable computer-readable storage media. In such embodiments, software may be loaded onto non-volatile storage 845 or, alternatively, directly into memory 840 via peripheral interface 855. Peripheral interface 855 may use an industry standard connection, such as RS-232 or Universal Serial Bus (USB), to connect with external devices 860.

Display interface 865 may connect computer 805 to display 870. Display 870 may be used, in some embodiments, to present a command line or graphical user interface to a user of computer 805. Display interface 865 may connect to display 870 using one or more proprietary or industry standard connections, such as VGA, DVI, DisplayPort and HDMI.

As described above, network interface 850, provides for communications with other computing and storage systems or devices external to computer 805. Software programs and data discussed herein may be downloaded from, for example, remote computer 815, web server 820, cloud storage server 825 and compute server 830 to non-volatile storage 845 through network interface 850 and network 810. Furthermore, the systems and methods described in this disclosure may be executed by one or more computers connected to computer 805 through network interface 850 and network 810. For example, in some embodiments the systems and methods described in this disclosure may be executed by remote computer 815, computer server 830, or a combination of the interconnected computers on network 810.

Data, datasets and/or databases employed in embodiments of the systems and methods described in this disclosure may be stored and or downloaded from remote computer 815, web server 820, cloud storage server 825 and compute server 830.

REFERENCE SIGNS LIST

200: Substrate Processing System
212, 214, 216, 218: Load Locks
220: Loader device
222: Loader robot
232, 234: Load lock chambers
240: Transfer device
242: Transfer robot
252, 254, 256, 258: Process Chambers
260: Controller
300: Etching apparatus (processing chamber)
302: Access Transistor
303: Bit Line
304: Word Line
305: Capacitor, Memory Cell Capacitor (vertical pillar)
310: Reaction chamber
312: Plasma

320: Base
322: Electrostatic Chuck
340, 350: RF Power Supply
360: Gas source
401: Substrate
403, 417, 423: Dielectric Layer (e.g., SiO2)
405: Metal Layer (e.g., TiN)
407: Metal Layer
409: Oxide Semiconductor (e.g., IGZO)
411: Insulating film (e.g., SiN)
413, 419, 433: Mask
415: Vertical plate
421: Interstices
422: Intermediate vertical pillar
425: Gate Oxide (e.g., SiO2)
427: Gate Metal (e.g., TiN)
429: Void
435, 439: Metal
437: Etch Stopper (e.g., SiBN)
800: Network System
805: Computer
810: Network
815: Remote Computer
820: Web Server
825: Cloud Storage Server
830: Computer Server
835: Processor (CPU)
837: Bus
840: Memory
845: Non-volatile Storage
848: Program (computer code)
850: Network Interface
855: Peripheral Interface
860: External Devices
865: Display Interface
870: Display
901: CMOS, Substrate
903, 1109, 1301, 1407: Oxide
905, 909: Metal Layer (e.g., TiN)
907: Metal Layer
911: Amorphous Si
913, 1005: Hard Mask (SiN)
915, 1003: Hard Mask (Si)
917, 1011, 1013: Spacers
1001, 1007, 1009: Hard mask, spin-on (SOH, SiON)
1107: Sacrificial vertical pillar
1111: Gate Oxide
1113: Gate Metal
1305: Pillar Void
1307: Oxide Semiconductor
1401: Gate Offset space
1403: TiN
1405: Metal
1409: Etch Stopper (e.g., SiBN)
1501: Bit Line
1503A: Polymer
1503B: Air Gap Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A method of making a semiconductor device, the method comprising:
depositing an oxide semiconductor on a conductive material that is disposed on an oxide;
forming vertical plates that each include the oxide semiconductor by etching the oxide semiconductor, each plate having a width that is substantially one dimension of a memory cell;
filling voids between the series of vertical plates with an oxide;
forming a mask material over the vertical plates and the oxide, the mask material including a set of parallel mask ridges arranged at a predetermined pitch in a first direction that is substantially orthogonal to main sides of the vertical plates such that interstices are present in areas not covered by the set of parallel mask ridges and not covered by the oxide so as to expose portions of the vertical plates via the interstices;
etching the oxide semiconductor as masked by the mask material and then removing the mask material and the oxide to form vertical pillars of the oxide semiconductor in regions covered by the set of parallel mask ridges;
depositing a gate oxide on side surfaces of the vertical pillars; and
forming a metal gate on the gate oxide of each vertical pillar to form a plurality of word lines, wherein
the conductive material forms a plurality of bit lines corresponding to the vertical pillars.

2. The method of claim 1, wherein the semiconductor device is a dynamic random access memory (DRAM) device having a plurality of memory cells, each memory cell includes an access transistor including the oxide semiconductor as a channel of a vertical transistor, and a spacing between adjacent memory cells is twice a feature size (2F) of the plurality of memory cells.

3. The method of claim 1, further comprising:
forming the bit lines from the conductive material by etching the conductive material with an air gap between respective bit lines.

4. The method of claim 3, wherein the forming the bit lines includes:
filling gaps between the respective bit lines with a polymer material;
forming an oxide on the polymer material to cover at least a top surface of the polymer material; and
removing the polymer material to form the air gap between the bit lines while retaining the oxide over the air gap.

5. The method of claim 4, further comprising:
filling a residual open space over the oxide with an additional oxide.

6. The method of claim 4, wherein the removing the polymer material comprises heating the polymer material.

7. The method of claim 6, wherein the polymer material includes polyurea.

* * * * *